United States Patent
Kang

(10) Patent No.: US 7,567,109 B2
(45) Date of Patent: Jul. 28, 2009

(54) INTEGRATED CIRCUIT DEVICES GENERATING A PLURALITY OF DROWSY CLOCK SIGNALS HAVING DIFFERENT PHASES

(75) Inventor: Uk-Song Kang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 366 days.

(21) Appl. No.: 11/653,864

(22) Filed: Jan. 17, 2007

(65) Prior Publication Data

US 2007/0200609 A1 Aug. 30, 2007

(30) Foreign Application Priority Data

Feb. 28, 2006 (KR) ............... 10-2006-0019496

(51) Int. Cl.
G06F 1/04 (2006.01)
(52) U.S. Cl. ............... 327/295; 327/298; 327/115
(58) Field of Classification Search ............... 327/291, 327/293, 295, 296, 298, 115, 117
See application file for complete search history.

(56) References Cited

U.S. PATENT DOCUMENTS 5,463,337 A * 10/1995 Leonowich ............... 327/158
6,476,594 B1 * 11/2002 Roisen ............... 324/76.54
6,608,530 B1 * 8/2003 Green et al. ............... 331/25
7,084,712 B2 * 8/2006 Fujiwara ............... 331/51
7,368,961 B2 * 5/2008 Werner et al. ............... 327/156
2004/0117696 A1 6/2004 Ito
2005/0152190 A1 7/2005 Fukuda

FOREIGN PATENT DOCUMENTS

JP 09-008652 1/1997
KR 1020000074090 A 12/2000
KR 10-2004-0043365 A 5/2004

* cited by examiner

*Primary Examiner*—Lincoln Donovan
*Assistant Examiner*—Hai L. Nguyen
(74) *Attorney, Agent, or Firm*—Harness, Dickey & Pierce, P.L.C.

(57) ABSTRACT

An integrated circuit device which internally generates a plurality of drowsy clock signals having different phases is provided. The integrated circuit device includes a phase synchronizer configured to output a plurality of clock signals having different phases in response to an external clock signal and a drowsy clock signal output unit configured to divide frequencies of the plurality of clock signals by a first factor, align the frequency-divided clock signals so that each consecutive clock signal has a constant phase difference relative to a phase difference of a preceding clock signal, and output the drowsy clock signals having lower frequencies and different phases. The integrated circuit device also includes a feedback unit configured to divide frequency of a clock signal with a phase angle of 0 output by the phase synchronizer by the first factor and output the frequency-divided clock signal having a phase angle of 0 degrees to an input port of the phase synchronizer.

25 Claims, 13 Drawing Sheets

INTEGRATED CIRCUIT DEVICES GENERATING A PLURALITY OF DROWSY CLOCK SIGNALS HAVING DIFFERENT PHASES

PRIORITY STATEMENT

This non-provisional U.S. patent application claims priority under 35 U.S.C. § 119 to Korean Patent Application No. 10-2006-0019496, filed on Feb. 28, 2006, in the Korean Intellectual Property Office (KIPO), the entire contents of which are incorporated herein by reference.

BACKGROUND

Description of the Related Art

Performance of integrated circuit devices are electrically tested after being manufactured. Integrated circuit devices performing relatively well under test are released to the market, while integrated circuit devices that perform relatively poorly under test are discarded. Conventionally, two types of tests are executed on manufactured integrated circuit devices. One of the tests is an electrical die sort (EDS) test for testing integrated circuit devices formed on a wafer, and the other is a package test for testing packages in which the integrated circuit devices are encapsulated with an encapsulating material, such as, a compound.

Test equipment is used to test the electrical performance of integrated circuit devices. Test equipment is classified into test equipment which generates relatively high-frequency test signals and test equipment which generates relatively low-frequency test signals. Test equipment generating relatively high-frequency test signals may be relatively expensive, whereas test equipment generating relatively low-frequency test signals may be less expensive. In addition, upgrading test equipment may be difficult because it is relatively expensive to do so. Hence, tests on integrated circuit devices need to be performed according to the characteristics of test equipment.

FIG. 1 is a block diagram of a conventional integrated circuit device 101 tested using test equipment that generates a relatively low-frequency test signal. Referring to FIG. 1, the conventional integrated circuit device 101 may include a plurality of pads 111 through 115 and an internal circuit 121.

To test the electrical performance of the internal circuit 121, a plurality of low-frequency clock signals are output from the test equipment. The low-frequency clock signals are applied to the internal circuit 121 via the pads 111 through 115.

As described above, in the conventional art, the low-frequency clock signals output by the test equipment are applied to the internal circuit 121 via the pads 111 through 115. This may result in external noise entering the internal circuit 121 along with the low-frequency clock signals, which may change the phases of the low-frequency clock signals. This may hinder a precise performance test on the internal circuit 121.

SUMMARY

Example embodiments relate to an integrated circuit device, for example, an integrated circuit device which may generate (e.g., internally generate) a plurality of drowsy clock signals for testing internal circuits of integrated circuit devices at a lower or relatively low speed. Integrated circuit devices, according to example embodiments, may generate a plurality of relatively low, lower or low-frequency clock signals.

Example embodiments also provide an integrated circuit device which more precisely synchronizes phases of the low-frequency clock signals.

At least one other example embodiment provides an integrated circuit device. According to this example embodiment, a phase synchronizer may be configured to output a plurality of clock signals having different phases in response to an external clock signal. A drowsy clock signal output unit may be configured to divide frequencies of the plurality of clock signals by a first factor to generate a plurality of drowsy clock signals, align the plurality of drowsy clock signals to create a constant phase difference between each consecutive drowsy clock signal, and output the plurality of drowsy clock signals to an internal circuit for testing the performance of the internal circuit, the plurality of drowsy clock signals having lower frequencies and different phases than the plurality of clock signals. A feedback unit may be configured to divide a frequency of one of the plurality of clock signals having a phase angle of 0 degrees by the first factor and output the frequency-divided clock signal having a phase angle of 0 degrees to an input port of the phase synchronizer.

At least one example embodiment provides an integrated circuit device having an internal circuit. In this example embodiment, the integrated circuit device may include a phase synchronizer configured to output a plurality of clock signals having different phases in response to an external clock signal. A drowsy clock signal output unit may be configured to divide frequencies of the plurality of clock signals by N to generate a plurality of drowsy clock signals, align the plurality of drowsy clock signals to create a constant phase difference between each consecutive drowsy clock signal, and output a plurality of drowsy clock signals having frequencies lower and different phases than the plurality of clock signals. A drowsy reference clock signal output unit may be configured to frequency-divide a clock signal having a phase of 0 degrees by 2N and output a drowsy reference clock signal, a feedback unit may be configured to frequency-divide the clock signal with the phase of 0 degrees by N and output the frequency-divided clock signal having the phase of 0 degrees to an input port of the phase synchronizer.

According to an example embodiment an integrated circuit device may include a phase synchronizer configured to output a plurality of high-frequency clock signals having different phases in response to an external clock signal. A drowsy clock signal output unit configured to divide the frequencies of the high-frequency clock signals received from the phase synchronizer by a determined factor and align the frequency-divided clock signals so that each consecutive clock signal has a constant phase difference compared to a phase difference of the preceding clock signal and output a plurality of drowsy clock signals having low frequencies and different phases. A feedback unit may be connected to the phase synchronizer and may be configured to divide the frequency of a high-frequency clock signal with a phase angle of about 0 among the high-frequency clock signals output by the phase synchronizer by the same factor as the factor of the frequency division performed to generate the drowsy clock signals and feeding the frequency-divided clock signal having a phase angle of 0 degrees back to an input port of the phase synchronizer, wherein the drowsy clock signals are applied to the internal circuit so as to test the performance of the internal circuit at a low speed.

The phase synchronizer may be one of a phase locked loop (PLL) and a delay locked loop (DLL). The external clock signal may be a low frequency clock signal output by test equipment for testing the integrated circuit device at a low speed, and the external clock signal and the drowsy clock signals may have identical frequencies.

In at least some example embodiments, the drowsy clock signal output unit may include a frequency-division and phase-alignment unit configured to divide the frequencies of the plurality of clock signals by a first factor to generate the drowsy clock signals and align the phases of the drowsy clock signals such that each consecutive drowsy clock signal has a constant phase difference compared to a phase difference of the preceding drowsy clock signal. A first multiplexer may be configured to receive the drowsy clock signals and the clock signals, select one of the two types of signals in response to an external selection signal, and apply the selected signals to the internal circuit.

According to at least some example embodiments, when five drowsy clock signals are generated during half of a cycle and the drowsy clock signals are obtained by frequency division by 2, the phase synchronizer may output a first high-frequency clock signal having a phase of 0 degrees and second through fifth high-frequency clock signals that are sequentially delayed relative to the first high-frequency clock signal by a first phase.

In at least this example embodiment, the frequency division and phase alignment unit may include a first D flipflop configured to receive the first high-frequency clock signal, frequency divide the first high-frequency clock signal by 2, and output a first drowsy clock signal having the same phase as the first high-frequency clock signal. A second D flipflop may be configured to receive the third high-frequency clock signal, frequency divide the third high-frequency clock signal by 2, and output a second drowsy clock signal having the same phase as the third high-frequency clock signal. A third D flipflop may be configured to receive the fifth high-frequency clock signal, frequency divide the fifth high-frequency clock signal by 2, and output a third drowsy clock signal having the same phase as the fifth high-frequency clock signal. A fourth D flipflop may be configured to receive the second high-frequency clock signal, frequency divide the second high-frequency clock signal by 2, and output a clock signal having the same phase as the second high-frequency clock signal. A first inverter may be connected to the fourth D flipflop and may be configured to invert the clock signal output by the fourth D flipflop and output a fourth drowsy clock signal. A fifth D flipflop may be configured to receive the fourth high-frequency clock signal, frequency divide the fourth high-frequency clock signal by 2, and output a clock signal having the same phase as the fourth high-frequency clock signal. A second inverter may be connect to the fifth D flipflop and may be configured to invert the clock signal output by the fifth D flipflop and outputting a fifth drowsy clock signal.

When the drowsy clock signals are each obtained by frequency division by 4, the frequency division and phase alignment unit may further include a sixth D flipflop connected to the first D flipflop and configured to frequency divide a clock signal output by the first D flipflop by 2 and output the frequency-divided clock signal as the first drowsy clock signal; a seventh D flipflop connected to the third D flipflop and configured to frequency divide the clock signal output by the third D flipflop by 2 and output the frequency-divided clock signal as the second drowsy clock signal; an eighth D flipflop connected to the second inverter and configured to frequency divide the clock signal output by the second inverter by 2 and output the frequency-divided clock signal as the third drowsy clock signal; a ninth D flipflop connected to the second D flipflop and configured to frequency divide the clock signal output by the second D flipflop by 2 and output the frequency-divided clock signal; a third inverter connected to the ninth D flipflop and configured to invert the clock signal output by the ninth D flipflop and output the inverted clock signal as the fourth drowsy clock signal; a tenth D flipflop connected to the first inverter and configured to frequency divide the clock signal output by the first inverter by 2 and output the frequency-divided clock signal; and a fourth inverter connected to the tenth D flipflop and configured to invert the clock signal output by the tenth D flipflop and output the inverted clock signal as the fifth drowsy clock signal.

When the each of the drowsy clock signals are obtained by frequency division by a multiple of 4, the frequency division and phase alignment unit may further include another set comprising the sixth through tenth D flipflops and the third and fourth inverters.

When two drowsy clock signals are generated during half of a cycle and each of the drowsy clock signals are obtained by frequency division by 2, the phase synchronizer may output a first high-frequency clock signal having a phase of 0 degrees and a second high-frequency clock signal having a phase difference of 180 degrees relative to the first high-frequency clock signal.

In at least this example embodiment, the frequency division and phase alignment unit may include a first D flipflop configured to receive the first high-frequency clock signal, frequency divide the first high-frequency clock signal by 2, and output a first drowsy clock signal that is in phase with the first high-frequency clock signal; an inverter configured to receive the second high-frequency clock signal and invert the second high-frequency clock signal; and a second D flipflop connected to the inverter and configured to frequency divide a high-frequency clock signal output by the inverter by 2 and output a second drowsy clock signal having a phase difference of 180 degrees from the first drowsy clock signal.

According to at least some example embodiments, when the number of drowsy clock signals generated during half of a cycle is 2, and each of the drowsy clock signals are obtained by frequency division by a multiple of 2, the frequency division and phase alignment unit may further include another first D flipflop, another second D flipflop and another inverter.

In at least some example embodiments, the feedback unit may include a frequency divider configured to receive a high-frequency clock signal having a phase of 0 degrees among the high-frequency clock signals output by the phase divider and divide the frequency of the high-frequency clock signal having the 0° phase by the same factor as the factor for the frequency division performed to generate the drowsy clock signals; and a second multiplexer configured to receive the high-frequency clock signal having the 0° phase and a clock signal output by the frequency divider, select one of the two signals in response to the external selection signal, and applying the selected signal to the phase synchronizer.

Another example embodiment provides an integrated circuit device having an internal circuit. In at least this example embodiment, the integrated circuit device may include a phase synchronizer, a drowsy clock signal output unit, a drowsy reference clock signal output unit and a feedback unit. The phase synchronizer may be configured to output a plurality of high-frequency clock signals having different phases in response to an external clock signal. The drowsy clock signal output unit may be configured to receive the high-frequency clock signals from the phase synchronizer, divide the frequencies of the high-frequency clock signals by N, aligning the frequency-divided clock signals so that each consecutive clock signal has a constant phase difference compared to a phase difference of the preceding clock signal, and output a plurality of drowsy clock signals having low frequencies and different phases. The drowsy reference clock signal output unit may receive a high-frequency clock signal having a phase of 0 degrees among the high-frequency clock signals output by the phase synchronizer, divide the high-frequency clock signal having the phase of 0 degrees by a factor twice the factor of the frequency division performed to generate the drowsy clock signals, and output a drowsy reference clock signal. The feedback unit may be connected to the phase synchronizer and may be configured to divide the frequency of the high-frequency clock signal with the phase of 0 degrees by the same factor as the factor of the frequency division performed to generate the drowsy reference clock signal and feeding the frequency-divided clock signal having the phase of 0 degrees back to an input port of the phase synchronizer. The drowsy clock signals and the drowsy reference clock signal may be applied to the internal circuit so as to test the performance of the internal circuit at a low speed. The phase synchronizer may be one of a phase locked loop (PLL) and a delay locked loop (DLL).

According to at least some example embodiments, the external clock signal may be a low frequency clock signal output by test equipment for testing the integrated circuit device at a low speed, and the external clock signal and the drowsy clock signals may have the same frequency.

According to at least some example embodiments, the drowsy clock signal output unit may include a divide-by-N frequency-division and phase-alignment unit configured to divide the frequencies of the high-frequency clock signals by N to generate the drowsy clock signals and align the phases of the drowsy clock signals so that each consecutive drowsy clock signal has a constant phase difference compared to a phase difference of the preceding drowsy clock signal; and a first multiplexer configured to receive the drowsy clock signals and the high-frequency clock signals, select one of the two types of signals in response to an external selection signal, and apply the selected signals to the internal circuit. The drowsy reference clock signal output unit may include a first divide-by-2 frequency divider configured to receive a high-frequency clock reference signal having a phase angle of 0 degrees among the high-frequency clock signals and divide the high-frequency clock signal having a phase angle of 0 degrees by 2; a first divide-by-2N frequency divider configured to divide the high-frequency clock signal having a phase angle of 0 degrees by a factor twice the factor of frequency division performed to generate the drowsy clock signals; and a second multiplexer configured to receive a clock signal output by the first divide-by-2 frequency divider and a clock signal output by the first divide-by-2N frequency divider, select one of the two clock signals in response to the external selection signal, and apply the selected signals to the internal circuit.

When five drowsy clock signals are generated during half of a cycle and the drowsy clock signals are each obtained by frequency division by 2, the phase synchronizer may output a first high-frequency, clock signal having a phase of 0 degrees and second through fifth high-frequency clock signals sequentially delayed relative to the first high-frequency clock signal by a first phase. In at least this example embodiment, the divide-by-N frequency division and phase alignment unit may include a first D flipflop configured to receive the first high-frequency clock signal, frequency divide the first high-frequency clock signal by 2, and output a first drowsy clock signal having the same phase as the first high-frequency clock signal; a second D flipflop configured to receive the third high-frequency clock signal, frequency divide the third high-frequency clock signal by 2, and output a second drowsy clock signal having the same phase as the third high-frequency clock signal; a third D flipflop configured to receive the fifth high-frequency clock signal, frequency divide the fifth high-frequency clock signal by 2, and output a third drowsy clock signal having the same phase as the fifth high-frequency clock signal; a fourth D flipflop configured to receive the second high-frequency clock signal, frequency divide the second high-frequency clock signal by 2, and output a clock signal having the same phase as the second high-frequency clock signal; a first inverter connected to the fourth D flipflop and invert the clock signal output by the fourth D flipflop and output a fourth drowsy clock signal; a fifth D flipflop configured to receive the fourth high-frequency clock signal, frequency divide the fourth high-frequency clock signal by 2, and output a clock signal having the same phase as the fourth high-frequency clock signal; and a second inverter connected to the fifth D flipflop and configured to invert the clock signal output by the fifth D flipflop and output a fifth drowsy clock signal.

In at least some example embodiments, when the drowsy clock signals are each obtained by frequency division by 4, the divide-by-N frequency division and phase alignment unit may further include a sixth D flipflop connected to the first D flipflop and configured to frequency divide a clock signal output by the first D flipflop by 2 and output the frequency-divided clock signal as the first drowsy clock signal; a seventh D flipflop connected to the third D flipflop and configured to frequency divide the clock signal output by the third D flipflop by 2 and output the frequency-divided clock signal as the second drowsy clock signal; an eighth D flipflop connected to the second inverter and configured to frequency divide the clock signal output by the second inverter by 2 and output the frequency-divided clock signal as the third drowsy clock signal; a ninth D flipflop connected to the second D flipflop and configured to frequency divide the clock signal output by the second D flipflop by 2 and output the frequency-divided clock signal; a third inverter connected to the ninth D flipflop and configured to invert the clock signal output by the ninth D flipflop and output the inverted clock signal as the fourth drowsy clock signal; a tenth D flipflop connected to the first inverter and configured to frequency divide the clock signal output by the first inverter by 2 and output the divided-divided clock signal; and a fourth inverter connected to the tenth D flipflop and configured to invert the clock signal output by the tenth D flipflop and output the inverted clock signal as the fifth drowsy clock signal.

According to at least some example embodiments, when the drowsy clock signals are each obtained by frequency division by a multiple of 4, the divide-by-N frequency division and phase alignment unit may further include another set including the sixth through tenth D flipflops and the third and fourth inverters.

When two drowsy clock signals are generated during half of a cycle and the drowsy clock signals are each obtained by frequency division by 2, the phase synchronizer may output a first high-frequency clock signal having a phase of 0 degrees and a second high-frequency clock signal having a phase difference of 180 degrees relative to the first high-frequency clock signal. In at least this example embodiment, the divide-by-N frequency division and phase alignment unit may include a first D flipflop configured to receive the first high-frequency clock signal, frequency divide the first high-frequency clock signal by 2, and output a first drowsy clock signal having the same phase as the first high-frequency clock signal; an inverter configured to receive the second high-frequency clock signal and invert the second high-frequency clock signal; and a second D flipflop connected to the inverter and configured to frequency divide a high-frequency clock signal output by the inverter by 2 and output a second drowsy clock signal having a phase difference of 180 degrees from the first drowsy clock signal.

When the number of drowsy clock signals generated during half of a cycle is 2, and the drowsy clock signals are each obtained by frequency division by a multiple of 2, the divide-by-N frequency division and phase alignment unit may further include another set comprising the first and second D flipflops and the inverter.

According to at least some example embodiments, the feedback unit may include a second divide-by-2 frequency divider configured to receive a high-frequency clock signal having a phase angle of 0 degrees among the high-frequency clock signals and divide the high-frequency clock signal having a phase angle of 0 degrees by 2; a second divide-by-2N frequency divider configured to receive the high-frequency clock signal having a phase angle of 0 degrees and divide the high-frequency clock signal having a phase angle of 0 degrees by the same factor as the factor of frequency division made by the first divide-by-2N frequency divider; and a third multiplexer configured to receive a clock signal output by the second divide-by-2 frequency divider and a clock signal output by the second divide-by-2N frequency divider, select one of the two clock signals in response to the external selection signal, and apply the selected signal to the phase synchronizer.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1:
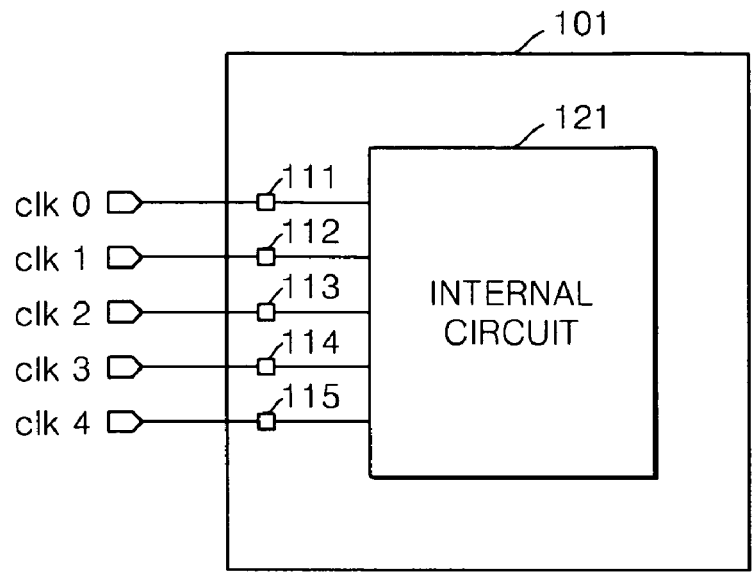
FIG. 1 is a block diagram of a conventional integrated circuit device.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
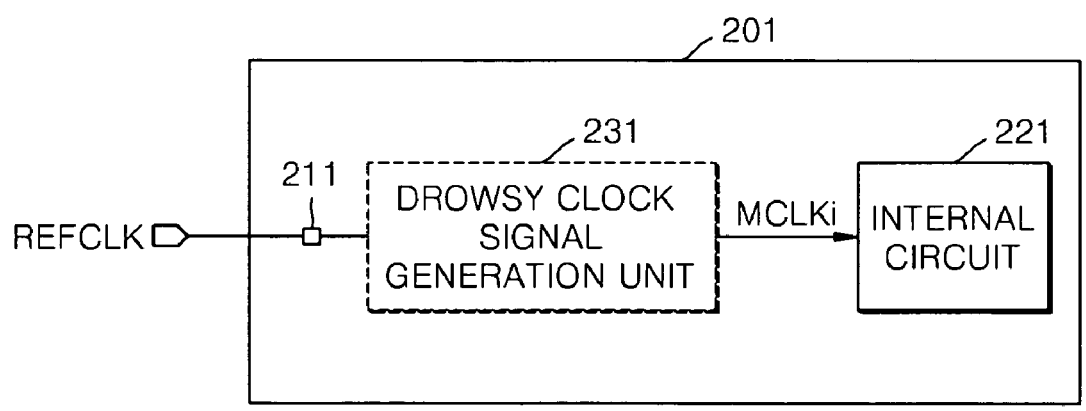
FIG. 2 is a block diagram of an integrated circuit device, according to an example embodiment.

FIG. 2 is a block diagram of an integrated circuit device 201, according to an example embodiment. The integrated circuit device 201 may include a pad 211, a drowsy clock signal generation unit 231 and/or an internal circuit 221.

An external reference clock signal REFCLK is input to the drowsy clock signal generation unit 231 via the pad 211. The drowsy clock signal generation unit 231 may generate a plurality of drowsy clock signals MCLKi having different phases and having relatively low frequencies in response to the external reference clock signal REFCLK. The drowsy clock signal generation unit 231 may apply the drowsy clock signals MCLKi to the internal circuit 221. The drowsy clock signal generation unit 231 may also generate relatively high-frequency clock signals. In other words, when the internal circuit 221 is tested at higher or relatively high speed, the drowsy clock signal generation unit 231 may generate the higher or relatively high-frequency clock signals. When the internal circuit 221 is tested at a relatively low speed, the drowsy clock signal generation unit 231 may generate the drowsy clock signals in response to the external reference clock signal REFCLK.

The external reference clock signal REFCLK may be a lower or relatively low-frequency clock signal, which is output by test equipment for testing the internal circuit 221 at a lower or relatively low speed. The external reference clock signal REFCLK may have the same or substantially the same frequency as the drowsy clock signals MCLKi.

As described above, the integrated circuit device 201, according to an example embodiment, may include one pad 211 and the internal circuit 221 may be tested at a lower or relatively low speed by the drowsy clock signal generation unit 231 generating the drowsy clock signals MCLKi having lower or relatively low frequencies in response to the external reference clock signal REFCLK received via the pad 211, and applying the drowsy clock signals MCLKi to the internal circuit 221. In addition, because the drowsy clock signals MCLKi from the drowsy clock signal generation unit 231 are applied (e.g., directly) to the internal circuit 221, external noise entering the drowsy clock signals MCLKi may be suppressed and/or prevented producing a more accurate electrical test on the internal circuit 221.

The drowsy clock signals MCLKi may be used in wafer tests and/or package tests to test a plurality of integrated circuit devices formed on a wafer and a package in which each of the integrated circuit devices is installed.

Figure 3:
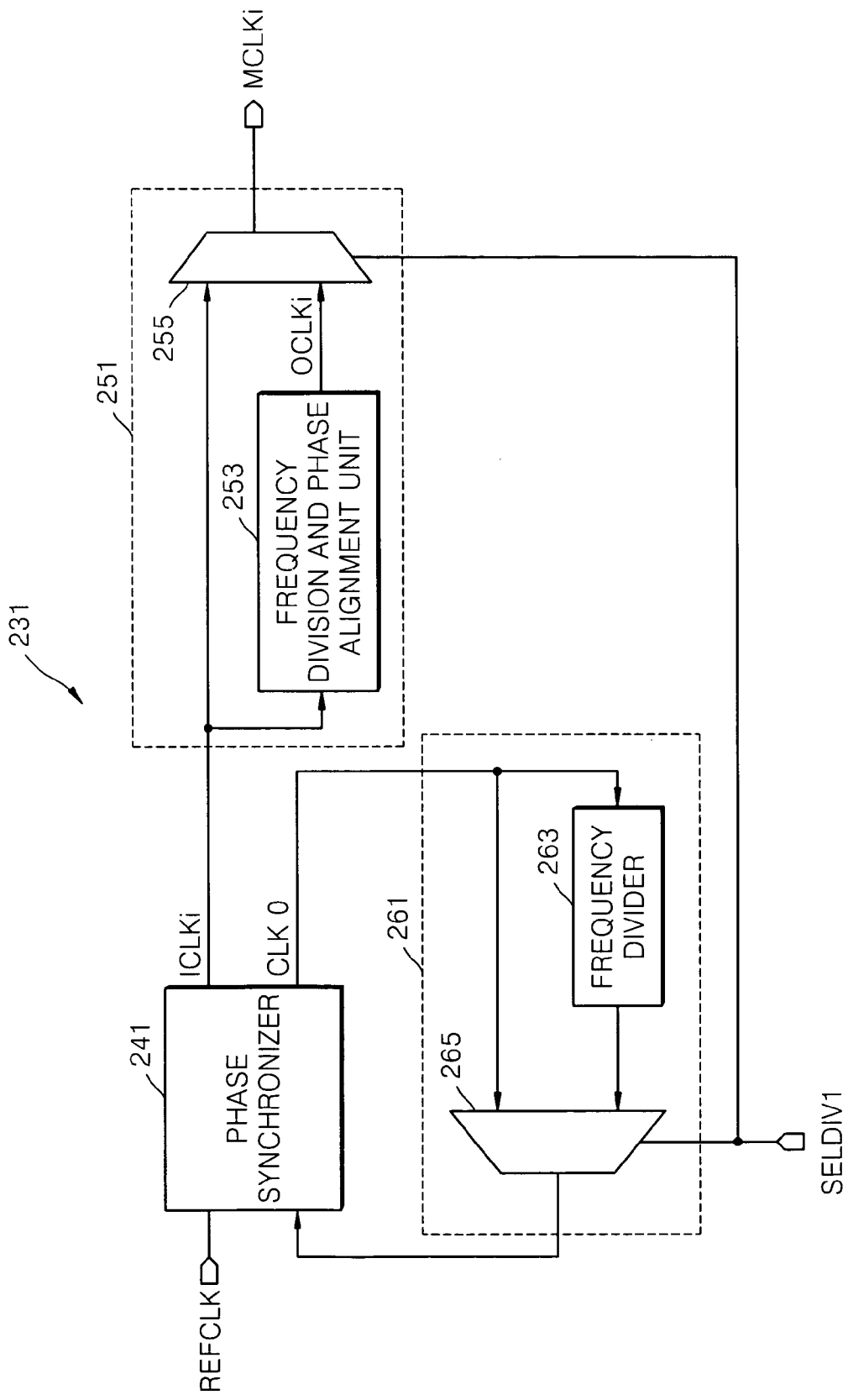
FIG. 3 is a block diagram of a drowsy clock signal generation unit, according to an example embodiment.

FIG. 3 is a block diagram of the drowsy clock signal generation unit, according to an example embodiment. The drowsy clock signal generation unit of FIG. 3 will be discussed with respect to the integrated circuit device 201 of FIG. 2; however, the drowsy clock signal generation unit 231 is not limited to this configuration, but instead may have any configuration suitable for performing the above-described functions. Referring to FIG. 3, the drowsy clock signal generation unit 231 may include a phase synchronizer 241, a drowsy clock signal output unit 251 and/or a feedback unit 261.

The phase synchronizer 241 may output a plurality of relatively high-frequency clock signals ICLKi having different phases in response to the external reference clock signal REFCLK. The phase synchronizer 241 may be implemented as a phase locked loop (PLL), a delay locked loop (DLL) or the like. The phase synchronizer 241 may have a lockable frequency (e.g., a minimum frequency that may be locked). For example, when the phase synchronizer 241 generates a relatively high-frequency clock signal with a frequency of greater than or equal to about 320 MHz, 320 MHz may be the minimum frequency of the phase synchronizer 241.

The drowsy clock signal output unit 251 receives the relatively high-frequency clock signals ICLKi from the phase synchronizer 241 and may output drowsy clock signals OCLKi having different phases, which are obtained by processing the relatively high-frequency clock signals ICLKi, or the unchanged relatively high-frequency clock signals ICLKi. The drowsy clock signals OCLKi may have the same or substantially the same frequency as that of the external reference clock signal REFCLK. The drowsy clock signal output unit 251 may include a frequency-division and phase-alignment unit 253 and/or a first multiplexer 255.

The frequency-division and phase-alignment unit 253 may generate the drowsy clock signals OCLKi by dividing the frequencies of the relatively high-frequency clock signals ICLKi by a multiple of N, such as, by 2, by 4, or by 8, and aligns the phases of the drowsy clock signals OCLKI so that each consecutive drowsy clock signal has a constant phase difference compared to that of the preceding drowsy clock signal.

The first multiplexer 255 receives the drowsy clock signals OCLKi and the relatively high-frequency clock signals ICLKi, selects one of the two types of signals in response to an external selection signal SELDIV1, and applies the selected signals to the internal circuit 221 of FIG. 2. When the external selection signal SELDIV1 is logic high, the first multiplexer 255 outputs the drowsy clock signals OCLKi. When the external selection signal SELDIV1 is logic low, the first multiplexer 255 outputs the relatively high-frequency clock signals ICLKi.

The feedback unit 261 may be connected to an output port and an input port of the phase synchronizer 241. The feedback unit 261 may feed a clock signal CLK0, output by the phase synchronizer 241, back to the input port of the phase synchronizer 241 to operate the external reference clock signal REFCLK in a testable frequency region. The feedback unit 261 may include a frequency divider 263 and/or a second multiplexer 265.

The frequency divider 263 may divide the frequency of the clock signal CLK0 with a phase angle of 0, which may be included in the relatively high-frequency clock signals ICLKi output by the phase synchronizer 241, by the same factor as that which the drowsy clock signals OCLKi are divided by. For example, if the drowsy clock signals OCLKi are divided by 8, the frequency divider 263 may divide the relatively high-frequency clock signal by 8.

As described above, the phase synchronizer 241 may have a lockable frequency (e.g., a minimum frequency that may be locked). Hence, the feedback unit 261 may include the frequency divider 263 to operate the external reference clock signal REFCLK in a testable frequency region during an operation of the phase synchronizer 241. The frequency dividing factor of the frequency divider 263 may be set to a value obtained by dividing a lower (e.g., the minimum) operating frequency of the phase synchronizer 241 by a higher (e.g., a maximum) frequency allowed by test equipment used to test the integrated circuit device 201. For example, when the minimum frequency of the phase synchronizer 241 is 320 MHz and the maximum frequency allowed by the used test equipment is 40 MHz, the frequency dividing factor of the frequency divider 263 may be set to 8.

The second multiplexer 265 receives the relatively high-frequency clock signal with a phase angle of 0 from the phase synchronizer 241 and a clock signal output by the frequency divider 263, may select and transmit one of the two signals to the phase synchronizer 241 in response to the external selection signal SELDIV1.

Figure 4:
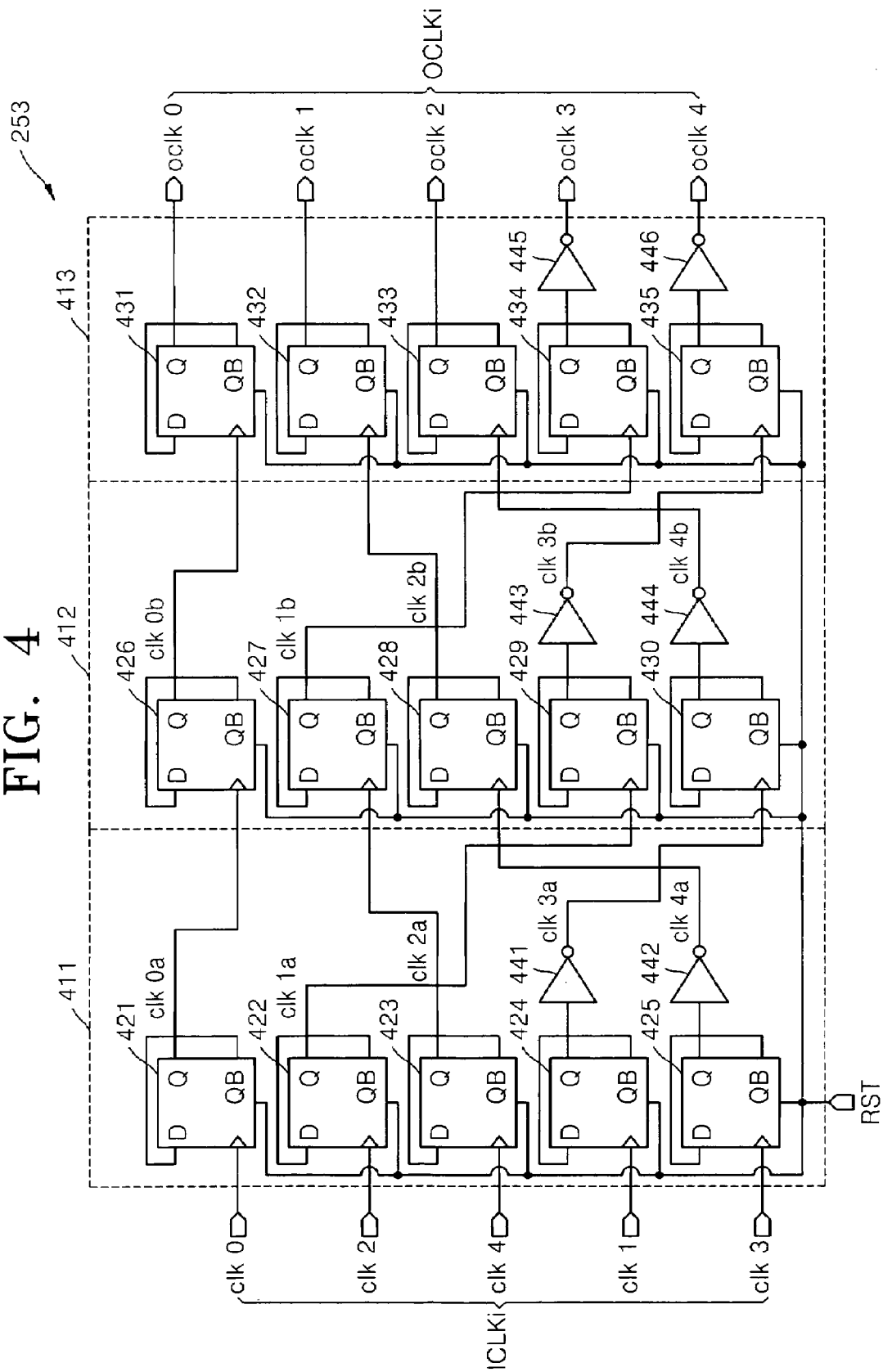
FIG. 4 is a circuit diagram of a frequency-division and phase-alignment unit, according to an example embodiment.

FIG. 4 is a circuit diagram of the frequency-division and phase-alignment unit, according to an example embodiment. The frequency-division and phase-alignment unit of FIG. 4 will be discussed with respect to the drowsy clock signal generation unit 231 of FIGS. 2 and 3; however, the frequency-division and phase-alignment unit is not limited to this configuration, but instead may have any configuration suitable for performing the above-described functions. Referring to FIG. 4, the frequency-division and phase-alignment unit 253 receives first through fifth relatively high-frequency clock signals clk0 through clk4 and has a structure that divides each of the received clock signals clk0 through clk4 by 8. The first relatively high-frequency clock signal clk0 has a phase with a 0 angle and the second through fifth relatively high-frequency clock signals clk1 through clk4 may be delayed (e.g., sequentially delayed) relative to the first relatively high-frequency clock signal clk0 by a specific phase for each signal.

Referring to FIG. 4, the frequency-division and phase-alignment unit 253 may include first through third frequency division parts 411 through 413 and may generate first through fifth drowsy clock signals oclk0 through oclk4.

The first frequency division part 411 may include first through fifth D flipflops 421 through 425, a first inverter 441 and/or a second inverter 442. The first frequency division part 411 may divide the frequencies of the first through fifth relatively high-frequency clock signals clk0 through clk4 by 2. The first D flipflop 421 may divide the frequency of the first relatively high-frequency clock signal clk0 by 2 and output a clock signal clk0a having the same or substantially the same phase as that of the first high-frequency clock signal clk0. The second D flipflop 422 may divide the frequency of the third relatively high-frequency clock signal clk2 by 2 and output a clock signal clk1a having the same or substantially the same phase as that of the third high-frequency clock signal clk2. The third D flipflop 423 divides the frequency of the fifth relatively high-frequency clock signal clk4 by 2 and output a clock signal clk2a having the same or substantially the same phase as that of the fifth relatively high-frequency clock signal clk4. The fourth D flipflop 424 may divide the frequency of the second relatively high-frequency clock signal clk1 by 2 and output a clock signal having the same phase as that of the second relatively high-frequency clock signal clk1. The first inverter 441 may invert the clock signal output by the fourth D flipflop 424 to output a clock signal clk3a. The fifth D flipflop 425 may divide the frequency of the fourth relatively high-frequency clock signal clk3 by 2 and output a clock signal having the same or substantially the same phase as that of the fourth relatively high-frequency clock signal clk3. The second inverter 442 may invert the clock signal output by the fifth D flipflop 425 to output a clock signal clk4a.

The second frequency division part 412 may include sixth through tenth D flipflops 426 through 430, a third inverter 443 and a fourth inverter 444, and may divide the frequencies of the high-frequency clock signals clk0a through clk4a by 2. The sixth D flipflop 426 may divide the frequency of the relatively high-frequency clock signal clk0a by 2 and output a clock signal clk0b. The seventh D flipflop 427 may divide the frequency of the relatively high-frequency clock signal clk2a by 2 and output a clock signal clk1b. The eighth D flipflop 428 may divide the frequency of the high-frequency clock signal clk4a by 2 and output a clock signal clk2b. The ninth D flipflop 429 may divide the frequency of the relatively high-frequency clock signal clk1a by 2 and output a clock signal. The third inverter 443 may invert the clock signal output by the ninth D flipflop 429 to output a clock signal clk3b. The tenth D flipflop 430 may divide the frequency of the high-frequency clock signal clk3a by 2 and output a clock signal. The fourth inverter 444 may invert the clock signal output by the tenth D flipflop 429 to output a clock signal clk4b.

The third frequency division part 413 may include eleventh through fifteenth D flipflops 431 through 435, a fifth inverter 445, and a sixth inverter 446, and may divide the frequencies of the clock signals clk0b through clk4b by 2 to output the first through fifth drowsy clock signals oclk0 through oclk4. The eleventh D flipflop 431 may divide the frequency of the clock signal clk0b by 2 and output the first drowsy clock signal oclk0. The twelfth D flipflop 432 may divide the frequency of the clock signal clk2b by 2 and output the second drowsy clock signal oclk1. The thirteenth D flipflop 433 may divide the frequency of the clock signal clk4b by 2 and output the third drowsy clock signal oclk2. The fourteenth D flipflop 434 may divide the frequency of the clock signal clk1b by 2 and output a clock signal. The fifth inverter 445 may invert the clock signal output by the fourteenth D flipflop 434 to output the fourth drowsy clock signal oclk3. The fifteenth D flipflop 435 may divide the frequency of the clock signal clk3b by 2 and output a clock signal. The sixth inverter 446 may invert the clock signal output by the fifteenth D flipflop 435 to output the fifth drowsy clock signal oclk4.

The first through fifteenth D flipflops 421 through 435 may be reset when a reset signal RST becomes active.

If the frequency-division and phase-alignment unit 253 of FIG. 4 includes only the first frequency division part 411, it may have a ½-frequency dividing function. If the frequency-division and phase-alignment unit 253 of FIG. 4 includes only the first and second frequency division parts 411 and 412, it may have a ¼-frequency dividing function. If the frequency-division and phase-alignment unit 253 of FIG. 4 includes one of the first through third frequency division parts 411 through 413 in addition to the first through third frequency division parts 411 through 413, it may have a ¹⁄₁₆-frequency dividing function. As described above, the frequency-division and phase-alignment unit 253 may have different frequency dividing functions based on the number of frequency division parts included therein. The number of frequency division parts included in the frequency-division and phase alignment unit 253 may be adjusted as desired.

Figure 5:
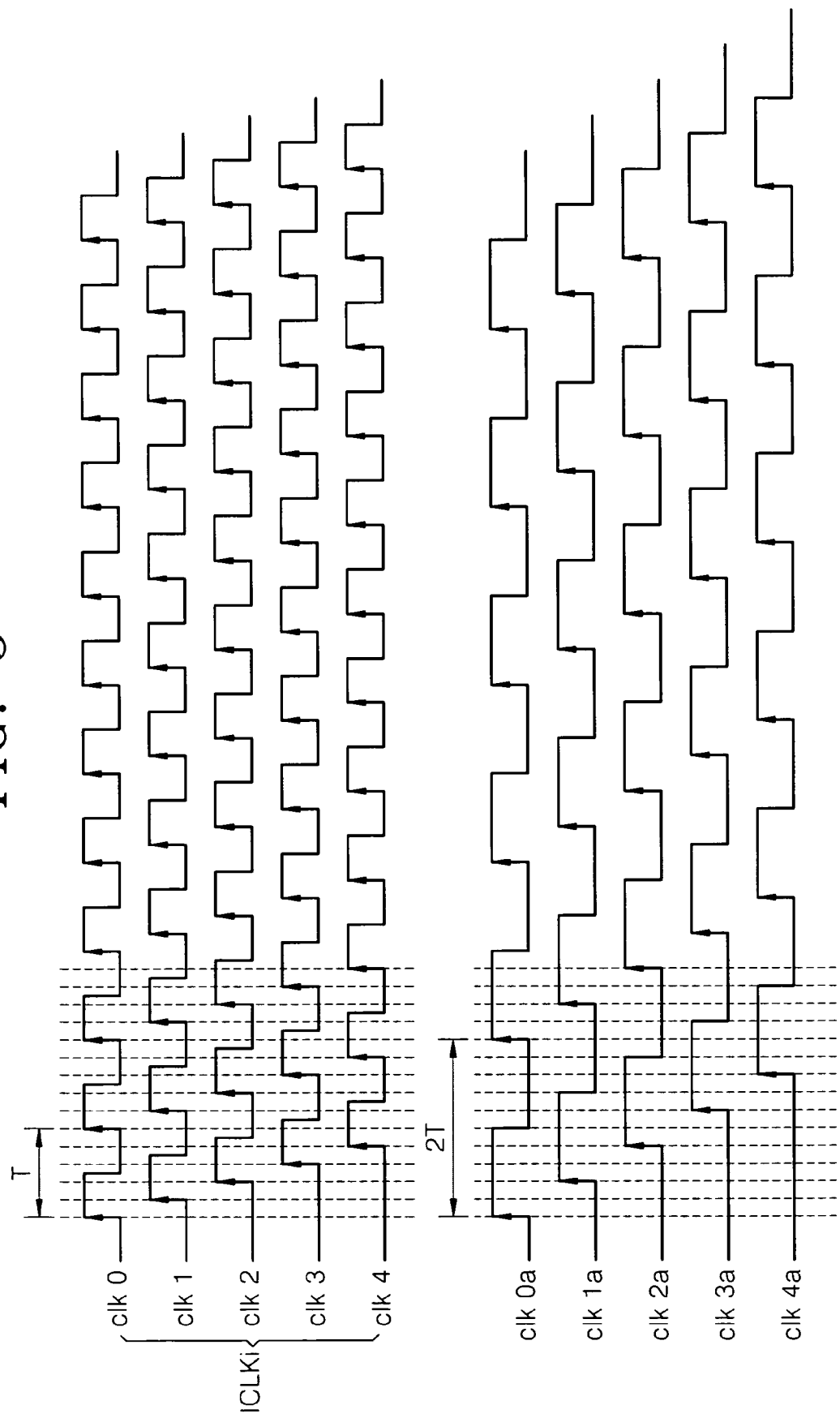
FIG. 5 is a timing diagram of clock signals input to and/or output from a first frequency division part of FIG. 4.

FIG. 5 is a timing diagram of the first through fifth high-frequency clock signals clk0 through clk4 input to the first frequency division part 411 of FIG. 4 and the clock signals clk0a through clk4a output there from. Referring to FIG. 5, the clock signals clk0a through clk4a are obtained by frequency dividing the first through fifth high-frequency clock signals clk0 through clk4 by 2. Accordingly, the period 2T of each of the clock signals clk0a through clk4a is twice the period T of each of the first through fifth high-frequency clock signals clk0 through clk4. For example, the frequencies of the clock signals clk0a through clk4a may be twice as low as those of the first through fifth high-frequency clock signals clk0 through clk4.

The clock signal clk0a may be in phase with the first high-frequency clock signal clk0. The clock signal clk1a may be in phase with the third high-frequency clock signal clk2. The clock signal clk2a may be in phase with the fifth high-frequency clock signal clk4. The clock signal clk3a may be in phase with the second high-frequency clock signal clk1. The clock signal clk4a may be in phase with the fourth high-frequency clock signal clk3.

The phases of the clock signals clk0a through clk4a may be aligned so that each consecutive clock signal has a constant phase difference compared to that of the preceding clock signal.

Figure 6:
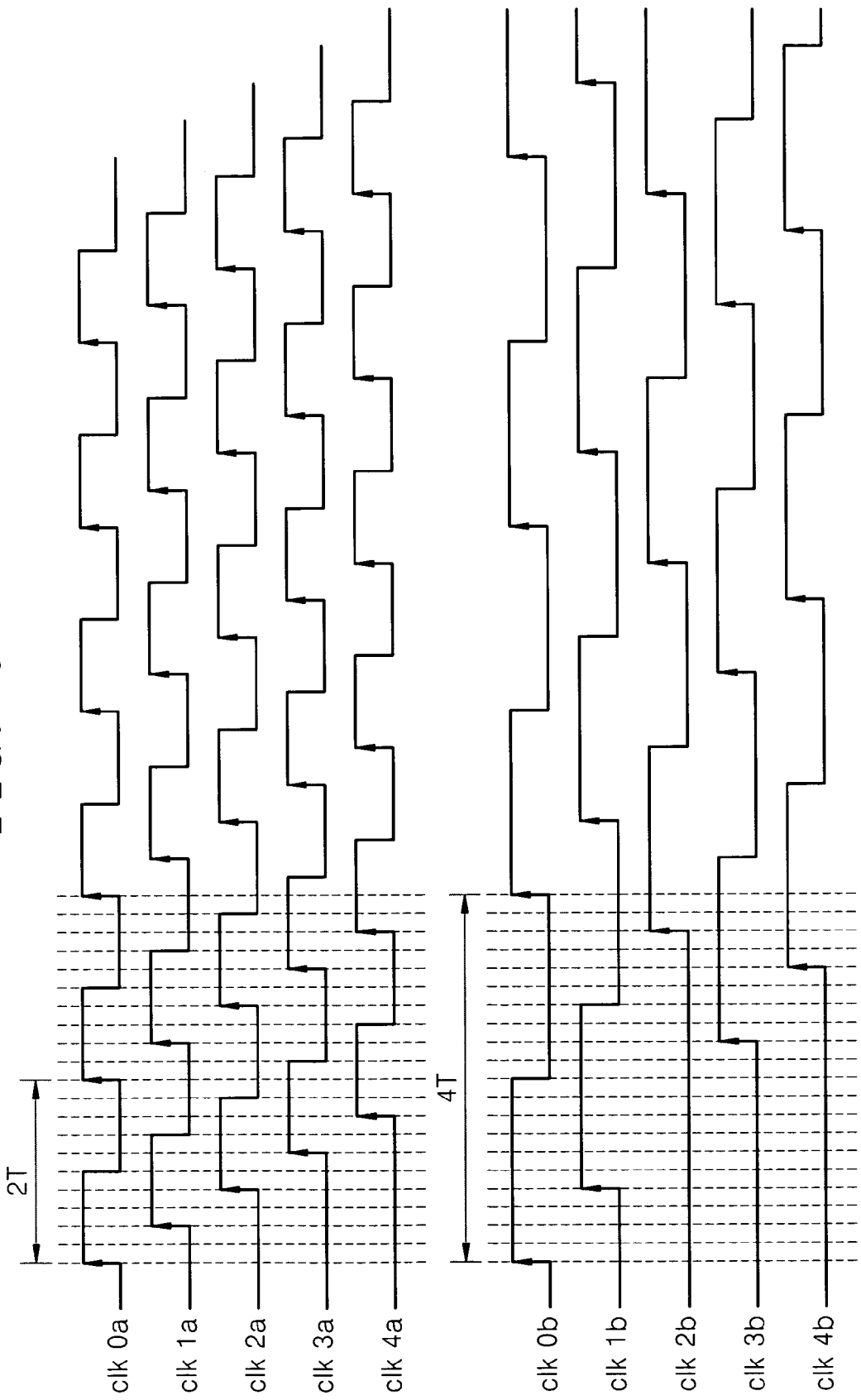
FIG. 6 is a timing diagram of clock signals input to and/or output from a second frequency division part of FIG. 4.

FIG. 6 is a timing diagram of the clock signals clk0a through clk4a input to the second frequency division part 412 of FIG. 4 and the clock signals clk0b through clk4b output there from. Referring to FIG. 6, the clock signals clk0b through clk4b may be obtained by frequency dividing the clock signals clk0a through clk4a by 2. Accordingly, the period 4T of each of the clock signals clk0b through clk4b may be twice the period 2T of each of the clock signals clk0a through clk4a. For example, the frequencies of the clock signals clk0b through clk4b may be twice as low as those of the clock signals clk0a through clk4a.

The clock signal clk0b may be in phase with the clock signal clk0a. The clock signal clk1b may be in phase with the clock signal clk2a. The clock signal clk2b may be in phase with the clock signal clk4a. The clock signal clk3b may be in phase with the clock signal clk1a. The clock signal clk4b may be in phase with the clock signal clk3a.

The clock signals clk0b through clk4b may be aligned so that each consecutive clock signal may have a constant phase difference compared to that of the preceding clock signal.

Figure 7:
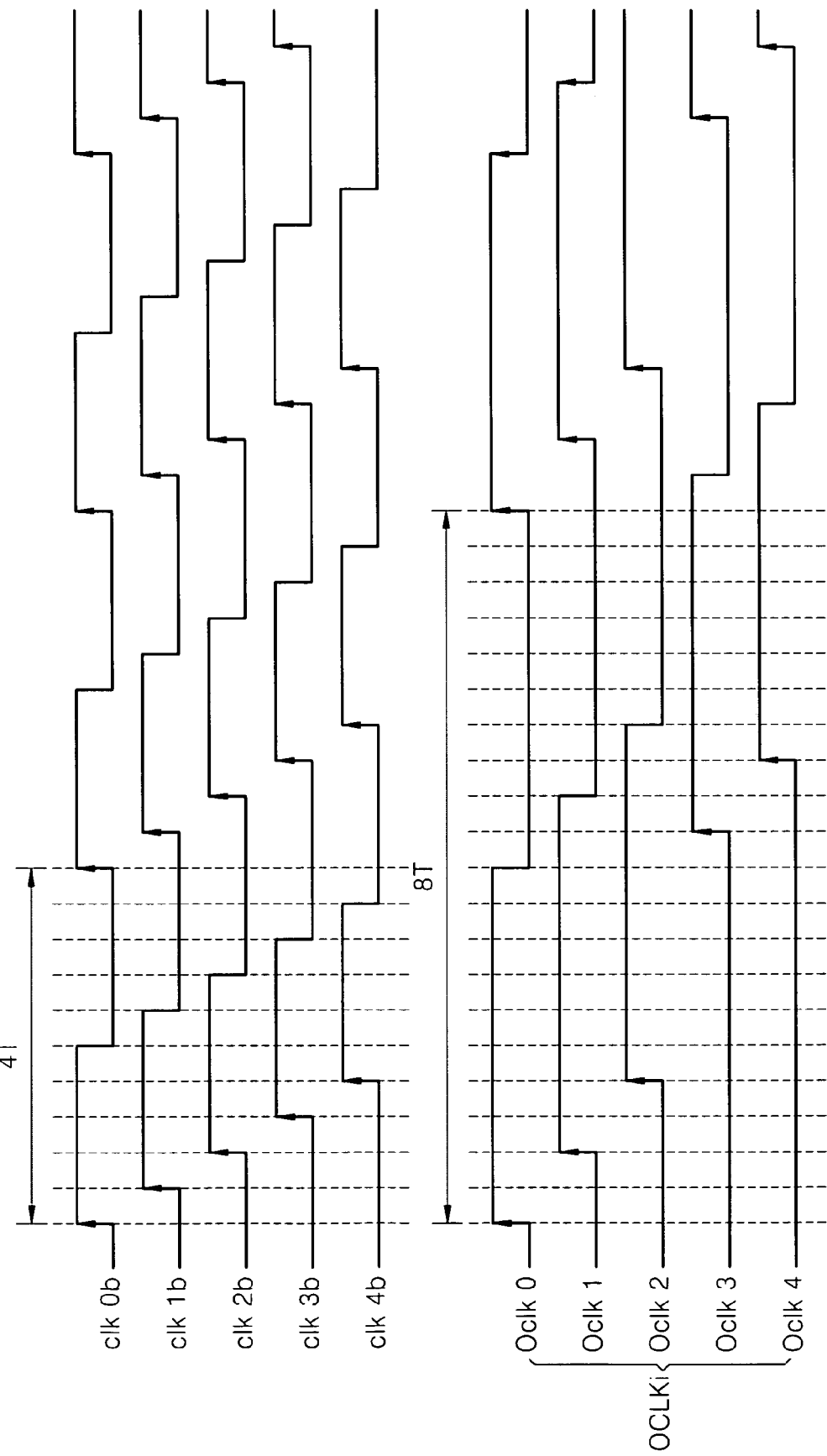
FIG. 7 is a timing diagram of clock signals input to and/or output from a third frequency division part of FIG. 4.

FIG. 7 is a timing diagram of the clock signals clk0b through clk4b input to the third frequency division part 413 of FIG. 4 and the first through fifth drowsy clock signals oclk0 through oclk4 output there from. Referring to FIG. 7, the first through fifth drowsy clock signals oclk0 through oclk4 may be obtained by frequency dividing the clock signals clk0b through clk4b by 2. Accordingly, the period 8T of each of the first through fifth drowsy clock signals oclk0 through oclk4 may be twice the period 4T of each of the clock signals clk0b through clk4b. For example, the frequencies of the first through fifth drowsy clock signals oclk0 through oclk4 may be twice as low as those of the clock signals clk0b through clk4b.

The first drowsy clock signal oclk0 may be in phase with the clock signal clk0b. The second drowsy clock signal oclk1 may be in phase with the clock signal clk2b. The third drowsy clock signal oclk2 may be in phase with the clock signal clk4b. The fourth drowsy clock signal oclk3 may be in phase with the clock signal clk1b. The fifth drowsy clock signal oclk4 may be in phase with the clock signal clk3b.

The first through fifth drowsy clock signals oclk0 through oclk4 may be aligned so that every two adjacent signals have the same or substantially the same (e.g., regular) phase difference between each other.

Figure 8:
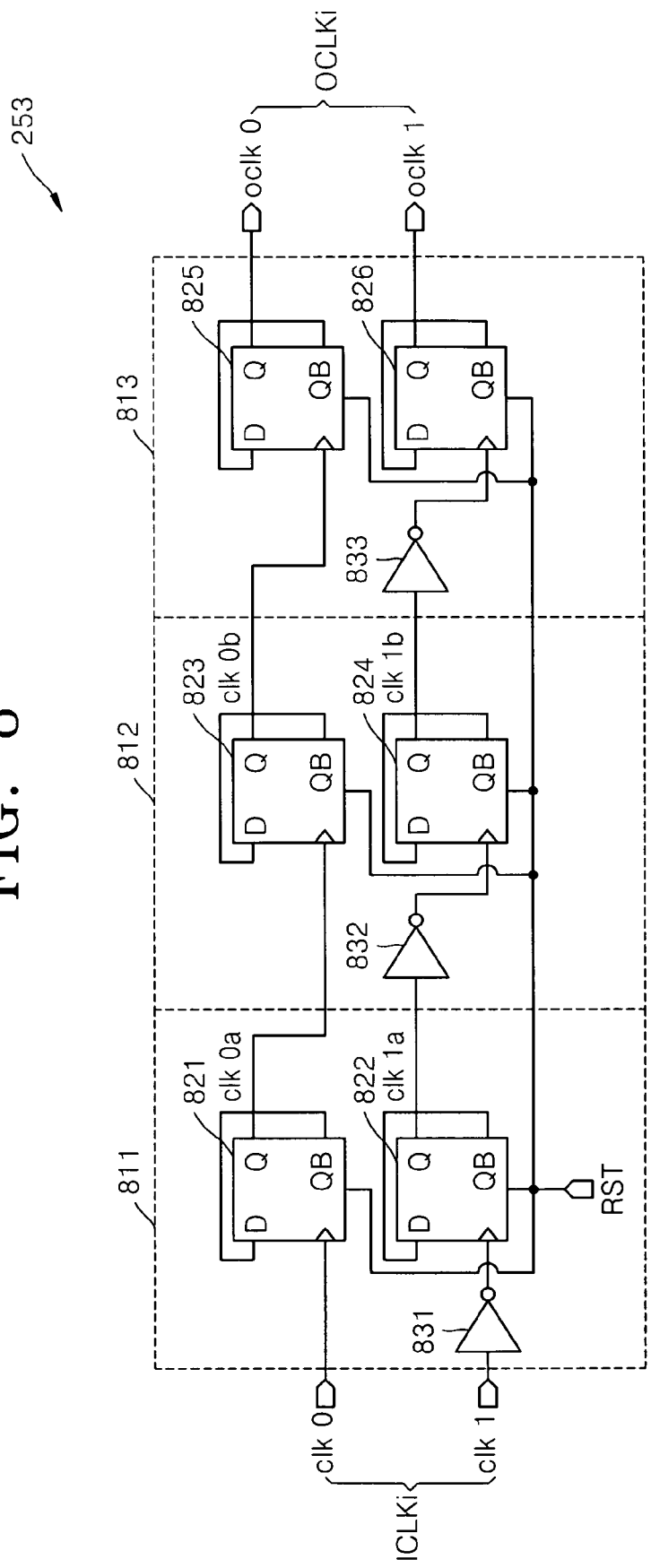
FIG. 8 is a circuit diagram of a frequency-division and phase-alignment unit, according to another example embodiment.

FIG. 8 is a circuit diagram of a frequency-division and phase-alignment unit, according to another example embodiment. Referring to FIG. 8, the frequency-division and phase-alignment unit 253 receives first and second relatively high-frequency clock signals clk0 and clk1 and may output first and second drowsy clock signals oclk0 and oclk1. The frequency-division and phase-alignment unit 253 of FIG. 8 may include first through third frequency division parts 811 through 813 and may divide the first and second high-frequency clock signals clk0 and clk1 by 8.

The first frequency division part 811 may include first and second D flipflops 821 and 822 and a first inverter 831. The first D flipflop 821 may divide the frequency of the first high-frequency clock signal clk0 by 2 and output a clock signal clk0a. The first inverter 831 may invert the second high-frequency clock signal clk1. The second D flipflop 822 may divide the frequency of the clock signal output by the first inverter 831 by 2 and output a clock signal clk1a.

The second frequency division part 812 may include third and fourth D flipflops 823 and 824 and a second inverter 832. The third D flipflop 823 may divide the frequency of the clock signal clk0a by 2 and output a clock signal clk0b. The second inverter 832 may invert the clock signal clk1a output by the second D flipflop 822. The fourth D flipflop 824 may divide the frequency of the clock signal output by the second inverter 832 by 2 and output a clock signal clk1b.

The third frequency division part 813 may include fifth and sixth D flipflops 825 and 826 and a third inverter 833. The fifth D flipflop 825 may divide the frequency of the clock signal clk0b by 2 and output the first drowsy clock signal oclk0. The third inverter 833 may invert the clock signal clk1b output by the fourth D flipflop 824. The sixth D flipflop 826 may divide the frequency of the clock signal output by the third inverter 833 by 2 and output the second drowsy clock signal oclk1.

The first through sixth D flipflops 821 through 826 may be reset when a reset signal RST becomes active.

Figure 9:
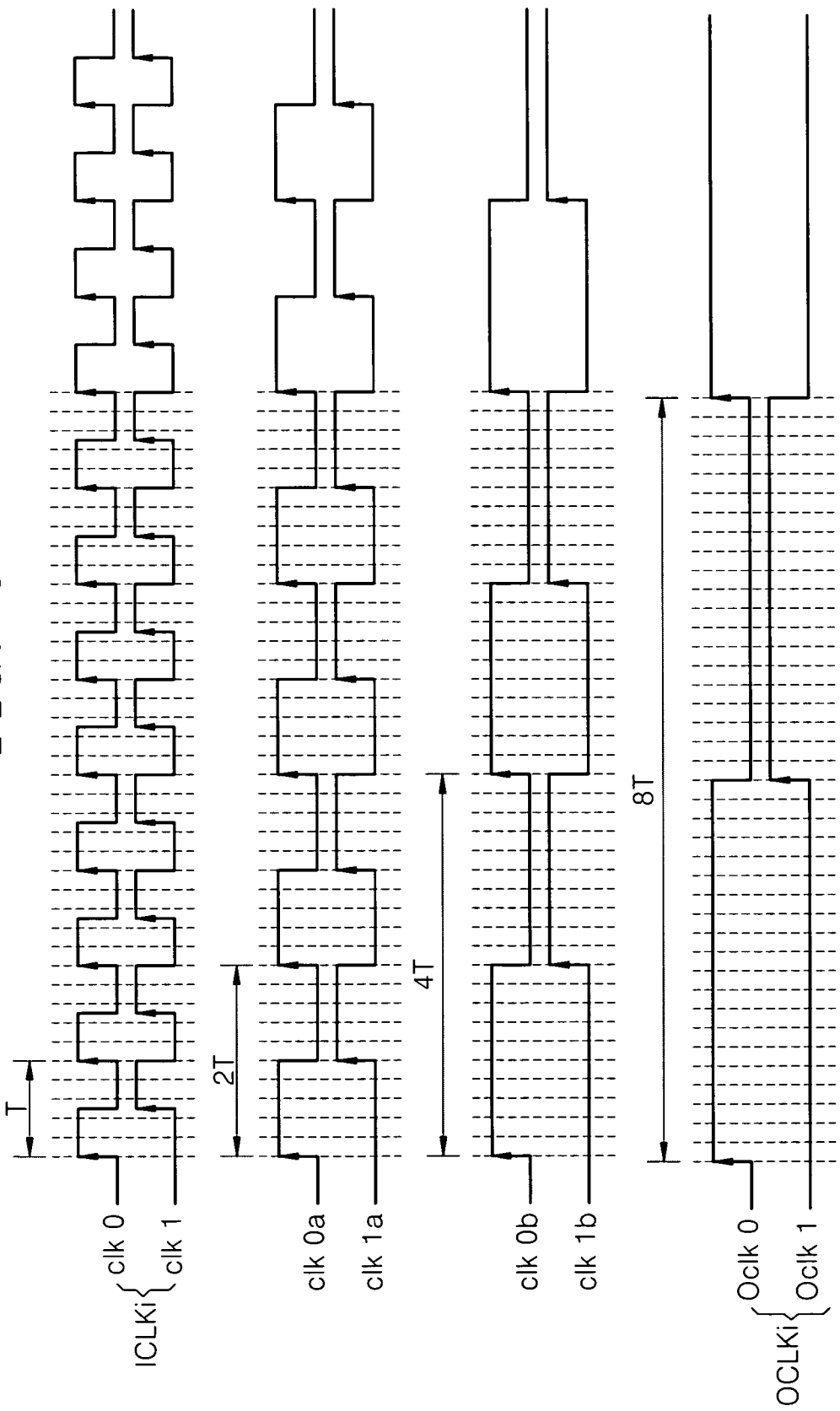
FIG. 9 is a timing diagram of clock signals of the circuit shown in FIG. 8.

FIG. 9 is a timing diagram of the clock signals clk0, clk1, clk0a, clk1a, clk0b, clk1b, oclk0, and oclk1. Referring to FIG. 9, the period 2T of each of the clock signals clk0a and clk1a may be twice the period T of each of the first and second relatively high-frequency clock signals clk0 and clk1. The clock signal clk1a may be delayed by 180 degrees in relation to the clock signal clk0a. The phases of the clock signals clk0a and clk1a may be aligned so as to have a constant or substantially constant phase difference.

The period 4T of each of the clock signals clk0b and clk1b may be twice the period 2T of each of the first and second relatively high-frequency clock signals clk0a and clk1a. The clock signal clk1b may be delayed by about 180 degrees in relation to the clock signal clk0b. The phases of the clock signals clk0b and clk1b may be aligned so as to have a constant or substantially constant phase difference.

The period 8T of each of the first and second drowsy clock signals oclk0 and oclk1 may be twice the period 4T of each of the clock signals clk0a and clk1a. The second drowsy clock signal oclk1 may be delayed by about 180 degrees in relation to the first drowsy clock signal oclk0. The phases of the first and second drowsy clock signals oclk0 and oclk1 may be aligned so as to have a constant or substantially constant phase difference.

Figure 10:
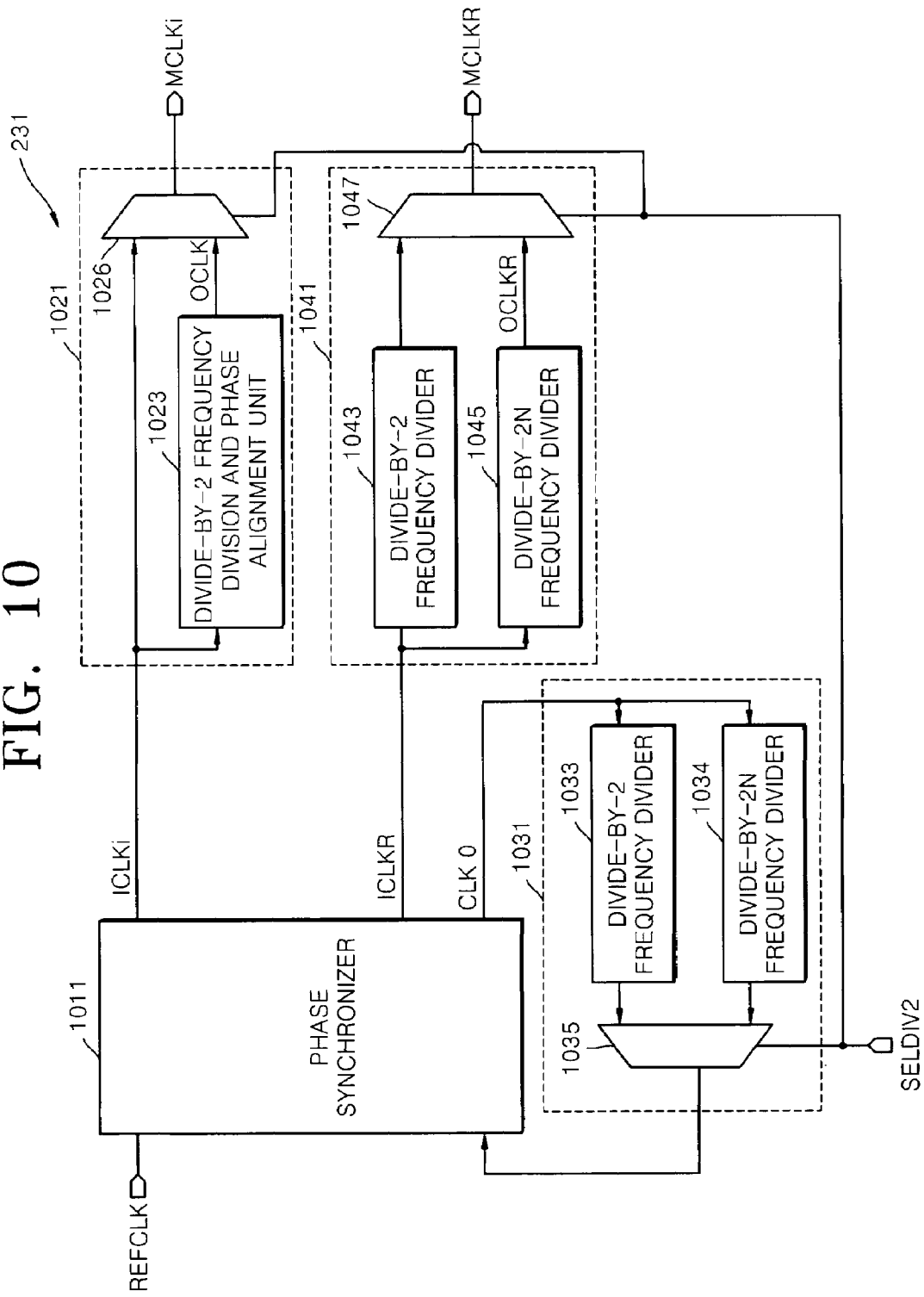
FIG. 10 is a block diagram of a drowsy clock signal generation unit, according to another example embodiment.

FIG. 10 is a block diagram of the drowsy clock signal generation unit, according to another example embodiment. Referring to FIG. 10, the drowsy clock signal generation unit 231 may include a phase synchronizer 1011, a drowsy clock signal output unit 1021, a drowsy reference clock signal output unit 1041 and/or a feedback unit 1031.

The phase synchronizer 1011 receives an external reference clock signal REFCLK and may output a plurality of high-frequency clock signals ICLKi having different phases, a relatively high-frequency reference clock signal ICLKR and a relatively high-frequency clock signal clk0 that has a 0° phase. The phase synchronizer 1011 may be implemented as a phase locked loop (PLL), a delay locked loop (DLL) or the like. The phase synchronizer 1011 has a lockable frequency (e.g., a minimum frequency that may be locked). For example, when the phase synchronizer 1011 generates a relatively high-frequency clock signal with a frequency of greater than or equal to about 320 MHz, 320 MHz may be the minimum frequency of the phase synchronizer 1011. The external reference clock signal REFCLK may be relatively low-frequency clock signal output by test equipment for relatively low or lower speed testing of the internal circuit 221 of FIG. 2 of the integrated circuit device 201.

The drowsy clock signal output unit 1021 receives a plurality of relatively high-frequency clock signals ICLKi from the phase synchronizer 1011 and may output a plurality of clock signals MCLKi. The clock signals MCLKi may be a plurality of drowsy clock signals OCLKi having different phases or the plurality of relatively high-frequency clock signals ICLKi. The drowsy clock signal output unit 1021 may include a divide-by-N frequency-division and phase-alignment unit 1023 and/or a first multiplexer 1026.

The divide-by-N frequency-division and phase-alignment unit 1023 may generate the drowsy clock signals OCLKi by dividing the frequencies of the high-frequency clock signals ICLKi by a multiple of 2N, such as, by 2, by 4, or by 8, and align the drowsy clock signals OCLKi so that every two adjacent drowsy clock signals have the same or substantially the same (e.g., a regular) phase difference between each other.

The first multiplexer 1026 may receive the drowsy clock signals OCLKi and the relatively high-frequency clock signals ICLKi, select and apply one of the two types of signals to the internal circuit 221 of FIG. 2 in response to an external selection signal SELDIV2.

The drowsy reference clock signal output unit 1041 may receive the relatively high-frequency reference clock signal ICLKR having a phase angle of about 0 degrees and may output a drowsy reference clock signal OCLKR by dividing the relatively high-frequency reference clock signal ICLKR by a factor that is twice the frequency dividing factor, N, used to generate the drowsy clock signals OCLKi. The drowsy reference clock signal OCLKR may have the same or substantially the same frequency as the external reference clock signal REFCLK. The drowsy clock signal output unit 1021 may include a first divide-by-2 frequency divider 1043, a first divide-by-2N frequency divider 1045 and/or a second multiplexer 1047.

The first divide-by-2 frequency divider 1043 may divide the relatively high-frequency reference clock signal ICLKR having a phase angle of about 0 degrees by 2 and output the frequency-divided clock signal.

The first divide-by-2N frequency divider 1045 may divide the relatively high-frequency reference clock signal ICLKR having a phase angle of about 0 degrees by a factor that is twice the frequency dividing factor, N, used to generate the drowsy clock signals OCLKi, and output the drowsy reference clock signal OCLKR. For example, when the drowsy clock signals OCLKi are each divided by 4, the first divide-by-2N frequency divider 1045 may divide the relatively high-frequency reference clock signal ICLKR by 8.

The second multiplexer 1047 receives the clock signal output by the first divide-by-2 frequency divider 1043 and the clock signal OCLKR output by the first divide-by-2N frequency divider 1045, may select and apply one of the two types of signals to the internal circuit 221 of FIG. 2 in response to the external selection signal SELDIV2.

The feedback unit 1031 may be connected to an output port and an input port of the phase synchronizer 1011. The feedback unit 1031 may feed the output signal CLK0 of the phase synchronizer 1011 back to the input port of the phase synchronizer 1011 to operate the external reference clock signal REFCLK in a testable frequency region. The feedback unit 1031 may include a second divide-by-2 frequency divider 1033, a second divide-by-2N frequency divider 1034 and/or a third multiplexer 1035.

The second divide-by-2 frequency divider 1033 may divide the high-frequency clock signal clk0 received from the phase synchronizer 1011 by 2 and output the frequency-divided clock signal.

The second divide-by-2N frequency divider 1034 may divide the frequency of the clock signal clk0 received from the phase synchronizer 1011 by the same or substantially the same factor as the factor for the frequency division performed by the first divide-by-2N frequency divider 1045. For example, if the first divide-by-2N frequency divider 1045 divides the received signal by 8, the second divide-by-2N frequency divider 1034 divides the high-frequency clock signal clk0 by 8.

The third multiplexer 1035 receives the clock signal output by the second divide-by-2 frequency divider 1033 and the clock signal output by the second divide-by-2N frequency divider 1034, may select and apply one of the two types of signals to the internal circuit 221 of FIG. 2 in response to the external selection signal SELDIV2.

As described above, the phase synchronizer 1011 has a lockable frequency (e.g., a minimum frequency that may be locked). Hence, the feedback unit 1031 may include the second divide-by-2 frequency divider 1033 and the second divide-by-2N frequency divider 1034 to operate the external reference clock signal REFCLK in a testable frequency region during an operation of the phase synchronizer 1011. The factor for the frequency division performed by the second divide-by-2N frequency divider 1034 may be set to be a value obtained by dividing the minimum operating frequency of the phase synchronizer 1011 by a maximum frequency allowed by the test equipment. For example, when the minimum frequency of the phase synchronizer 1011 is 320 MHz and the maximum frequency allowed by the test equipment is 40 MHz, the factor for the frequency division executed by the second divide-by-2N frequency divider 1034 is set to be 8.

The drowsy clock signals OCLKi and the drowsy reference clock signal OCLKR may be used in a wafer test and a package test for, respectively, testing a plurality of integrated circuit devices formed on a wafer and for testing a package in which each of the integrated circuit devices is installed.

Figure 11:
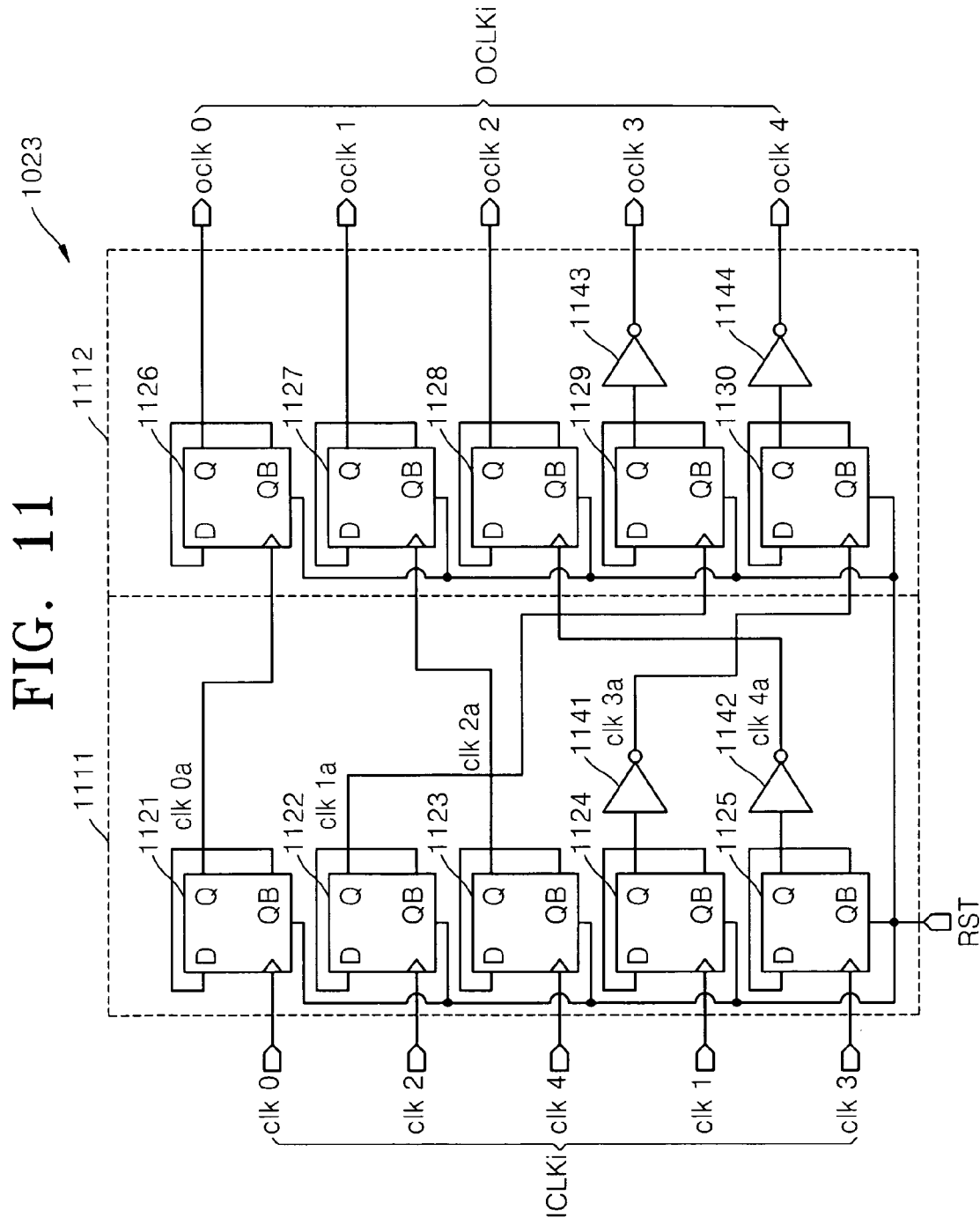
FIG. 11 is a circuit diagram of a divide-by-N frequency-division and phase-alignment unit shown in FIG. 10, according to an example embodiment.

FIG. 11 is a circuit diagram of the N frequency-division and phase-alignment unit 1023 shown in FIG. 10, according to an example embodiment. The N frequency-division and phase-alignment unit 1023 of FIG. 11 receives first through fifth high-frequency clock signals clk0 through clk4 and may have a structure that divides each of the received clock signals clk0 through clk4 by 4. The first high-frequency clock signal clk0 has a phase angle of 0 degrees, and the second through fifth high-frequency clock signals clk1 through clk4 may be delayed (e.g., sequentially delayed) relative to the first relatively high-frequency clock signal clk0 by a specific phase for each signal.

Referring to FIG. 11, the frequency-division and phase-alignment unit 1023 may include first and second frequency division parts 1111 and 1112. The frequency-division and phase-alignment unit 1023 receives the first through fifth high-frequency clock signals clk0 through clk4 and may generate first through fifth drowsy clock signals oclk0 through oclk4.

The first frequency division part 1111 may include first through fifth D flipflops 1121 through 1125, a first inverter 1141, and a second inverter 1142, and may divide the frequencies of the first through fifth high-frequency clock signals clk0 through clk4 by 2. For example, the first D flipflop 1121 may divide the frequency of the first high-frequency clock signal clk0 by 2 and output a clock signal clk0a which may be in phase with the first relatively high-frequency clock signal clk0. The second D flipflop 1122 may divide the frequency of the third relatively high-frequency clock signal clk2 by 2 and output a clock signal clk1a that is in phase with the third relatively high-frequency clock signal clk2. The third D flipflop 1123 may divide the frequency of the fifth relatively high-frequency clock signal clk4 by 2 and outputs a clock signal clk2a having the same or substantially the same phase as that of the fifth high-frequency clock signal clk4. The fourth D flipflop 1124 may divide the frequency of the second high-frequency clock signal clk1 by 2 and output a clock signal having the same or substantially the same phase as that of the second high-frequency clock signal clk1. The first inverter 1141 may invert the clock signal output by the fourth D flipflop 1124 to output a clock signal clk3a. The fifth D flipflop 1125 may divide the frequency of the fourth high-frequency clock signal clk3 by 2 and outputs a clock signal having the same phase as that of the fourth high-frequency clock signal clk3. The second inverter 1142 may invert the clock signal output by the fifth D flipflop 1125 to output a clock signal clk4a.

The second frequency division part 1112 may include sixth through tenth D flipflops 1126 through 1130, a third inverter 1143, and a fourth inverter 1144, and divides the frequencies of the high-frequency clock signals clk0a through clk4a by 2 and generates the first through fifth drowsy clock signals oclk0 through oclk4. For example, the sixth D flipflop 1126 may divide the frequency of the high-frequency clock signal clk0a by 2 and output the first drowsy clock signal oclk0. The seventh D flipflop 1127 may divide the frequency of the high-frequency clock signal clk2a by 2 and output the second drowsy clock signal oclk1. The eighth D flipflop 1128 may divide the frequency of the high-frequency clock signal clk4a by 2 and output the third drowsy clock signal oclk2. The ninth D flipflop 1129 may divide the frequency of the high-frequency clock signal clk1a by 2 and output a clock signal. The third inverter 1143 may invert the clock signal output by the ninth D flipflop 1129 to output the fourth drowsy clock signal oclk3. The tenth D flipflop 1130 may divide the frequency of the high-frequency clock signal clk3a by 2 and output a clock signal. The fourth inverter 1144 may invert the clock signal output by the tenth D flipflop 1130 to output the fifth drowsy clock signal oclk4.

If the divide-by-N frequency-division and phase-alignment unit 1023 includes only the first frequency division part 1111, it has a divide-by-2 frequency dividing function. If the frequency-division and phase-alignment unit 1023 includes the first and second frequency division parts 1111 and 1112, it has a divide-by-8 frequency dividing function. As described above, the frequency-division and phase-alignment unit 1023 may have various frequency dividing functions by adjusting the number of frequency division parts to be included therein.

Figure 12:
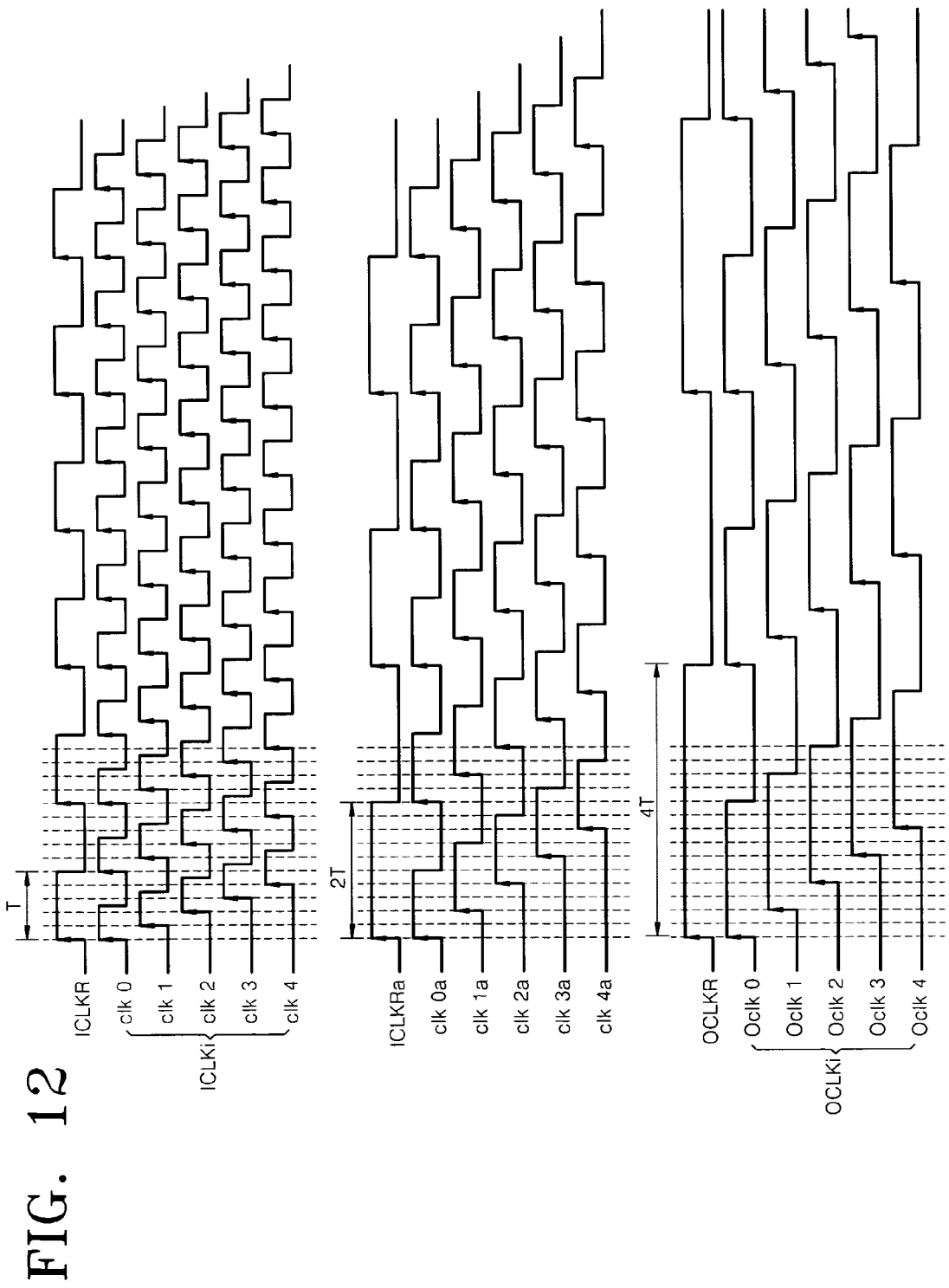
FIG. 12 is a timing diagram of clock signals shown in FIG. 11 and clock signals input to and/or output from a first divide-by-2 frequency divider shown in FIG. 10.

FIG. 12 is a timing diagram of the clock signals clk0 through clk4, clk0a through clk4a, and oclk0 through oclk4 shown in FIG. 11 and the clock signals ICLKR, ICLKRa, and OCLKR input to and/or output from the first divide-by-2 frequency divider 1045 shown in FIG. 10.

The period of the high-frequency reference clock signal ICLKR input to the first divide-by-2N frequency divider 1045 of FIG. 10 may be twice the period of the high-frequency clock signal ICLKi input to the frequency-division and phase-alignment unit 1023 of FIG. 11. The period of the drowsy reference clock signal OCLKR may be twice the period of each of the drowsy clock signals OCLKi. When the period doubles, the frequency halves.

The clock signals clk0a through clk4a may be obtained by frequency dividing the first through fifth high-frequency clock signals clk0 through clk4 by 2. Accordingly, the period of each of the clock signals clk0a through clk4a may be twice the period of each of the first through fifth high-frequency clock signals clk0 through clk4. The clock signal clk0a may be in phase with the first high-frequency clock signal clk0. The clock signal clk1a may be in phase with the third high-frequency clock signal clk2. The clock signal clk2a may be in phase with the fifth high-frequency clock signal clk4. The clock signal clk3a may be in phase with the second high-frequency clock signal clk1. The clock signal clk4a may be in phase with the fourth high-frequency clock signal clk3. The clock signal clk3a and clk4a are in phase with signals obtained by delaying the phases of the second and fourth high-frequency clock signals clk1 and clk3 by 180°, respectively. The clock signals clk0a through clk4a may be aligned so that each consecutive clock signal has a constant or substantially constant phase difference compared to that of the preceding clock signal.

The first through fifth drowsy clock signals oclk0 through oclk4 may be obtained by frequency dividing the clock signals clk0a through clk4a by 2. Accordingly, the period of each of the first through fifth drowsy clock signals oclk0 through oclk4 may be twice the period of each of the clock signals clk0a through clk4a. The first drowsy clock signal oclk0 may be in phase with the clock signal clk0a. The second drowsy clock signal oclk1 may be in phase with the clock signal clk1a. The third drowsy clock signal oclk2 may be in phase with the clock signal clk2a. The fourth drowsy clock signal oclk3 may be in phase with the clock signal clk3a. The fifth drowsy clock signal oclk4 may be in phase with the clock signal clk4a. The first through fifth drowsy clock signals oclk0 through oclk4 may be aligned so that each consecutive drowsy clock signal has a constant or substantially constant phase difference compared to that of the preceding drowsy clock signal.

Figure 13:
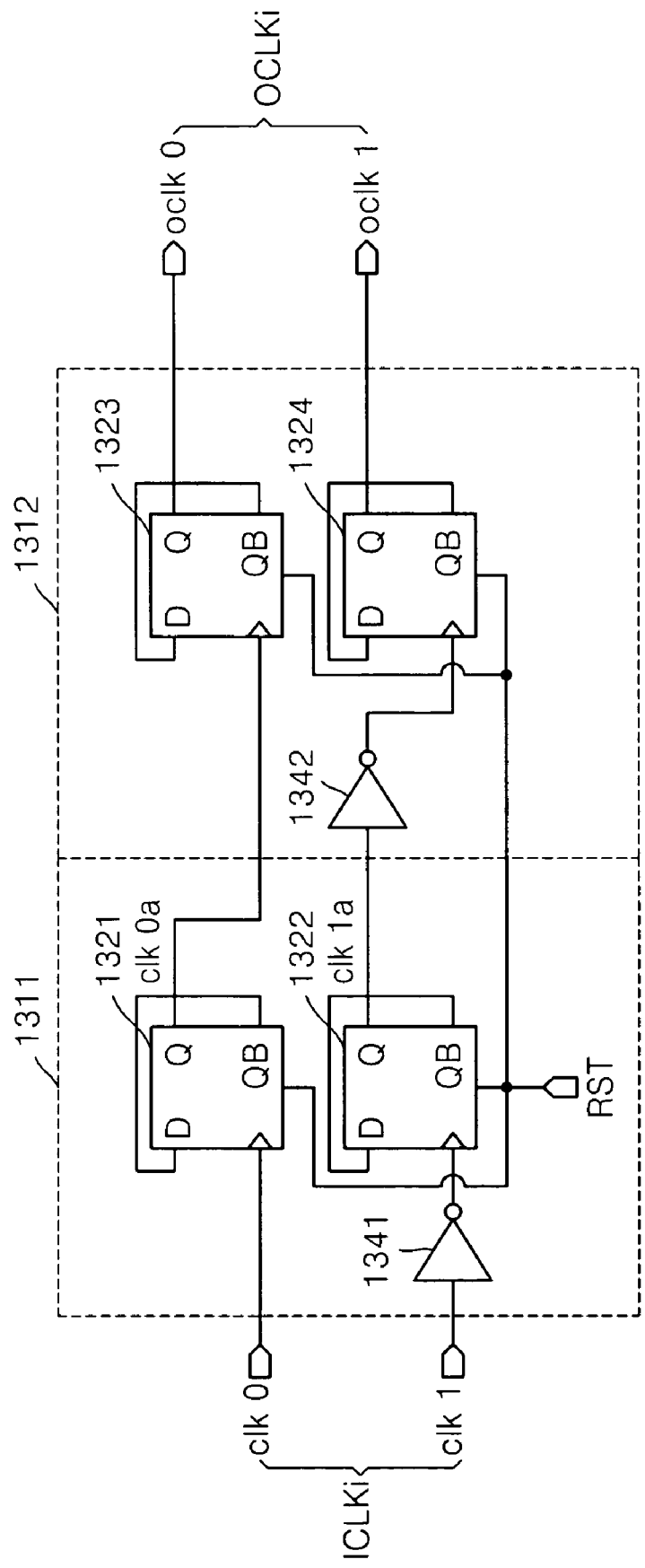
FIG. 13 is a circuit diagram of a divide-by-N frequency-division and phase-alignment unit shown in FIG. 10, according to another example embodiment.

FIG. 13 is a circuit diagram of the divide-by-N frequency-division and phase-alignment unit 1023 shown in FIG. 10, according to another example embodiment. The divide-by-N frequency-division and phase-alignment unit 1023 of FIG. 13 may divide first and second high-frequency clock signals clk0 and clk1 by 4 and output first and second drowsy clock signals oclk0 and oclk1. Referring to FIG. 13, the divide-by-N frequency-division and phase-alignment unit 1023 may include first and second frequency division parts 1311 and 1312.

The first frequency division part 1311 may include first and second D flipflops 1321 and 1322 and a first inverter 1341. The first D flipflop 1321 may divide the frequency of the first high-frequency clock signal clk0 by 2 and output a clock signal clk0a. The first inverter 1341 may invert the second high-frequency clock signal clk1. The second D flipflop 1322 may divide the frequency of the clock signal output by the first inverter 1341 by 2 and output a clock signal clk1a.

The second frequency division part 1312 may include third and fourth D flipflops 1323 and 1324 and a second inverter 1342. The third D flipflop 1323 may divide the frequency of the clock signal clk0a by 2 and output the first drowsy clock signal oclk0. The second inverter 1342 may invert the clock signal clk1a output by the second D flipflop 1322. The fourth D flipflop 1324 may divide the frequency of the clock signal output by the second inverter 1342 by 2 and output the second drowsy clock signal oclk1.

Figure 14:
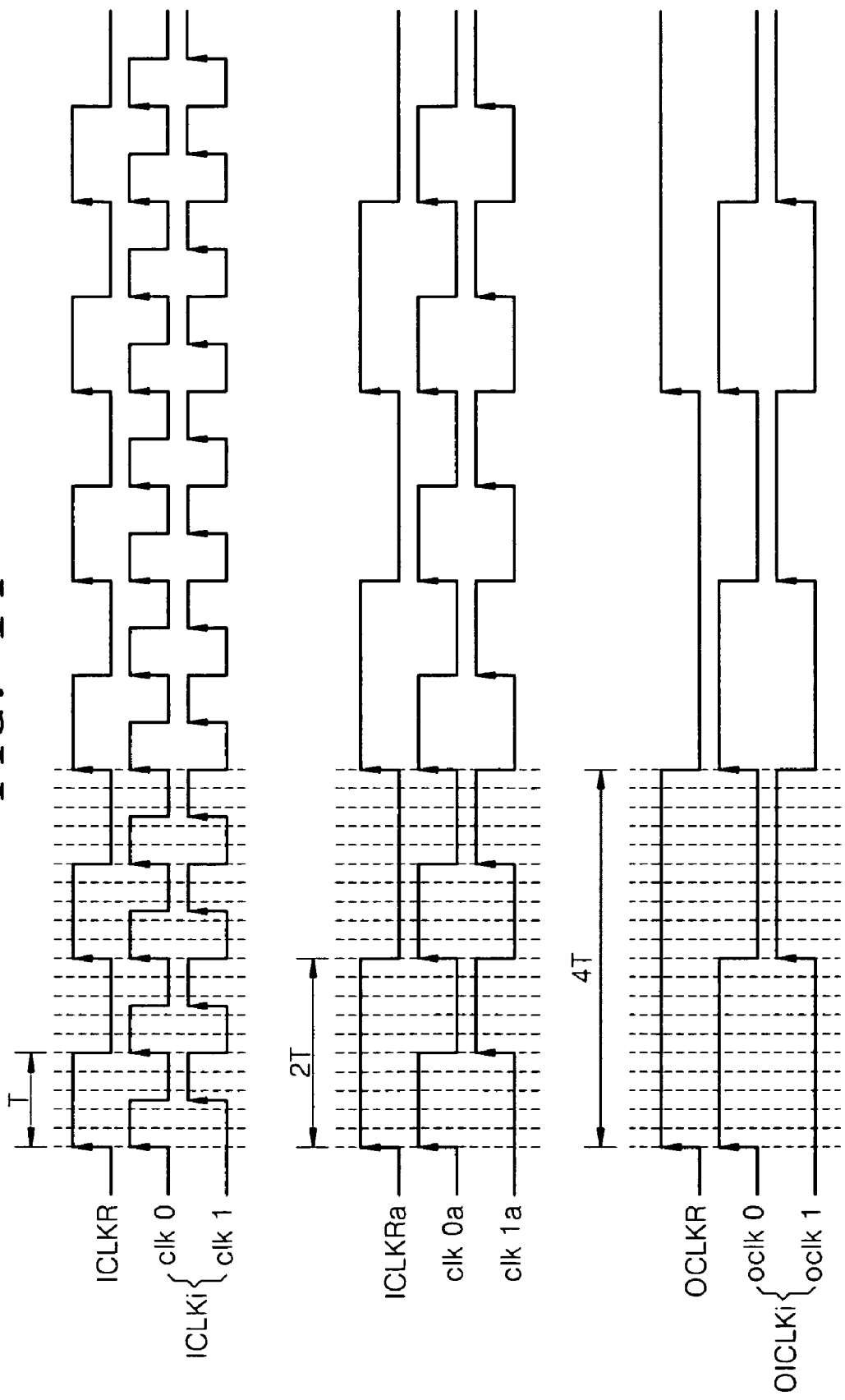
FIG. 14 is a timing diagram of clock signals of the circuit shown in FIG. 13 and clock signals input to and/or output from a first divide-by-2 frequency divider shown in FIG. 10.

FIG. 14 is a timing diagram of the clock signals clk0, clk1, clk0a, clk1a, oclk0, and oclk1 shown in FIG. 13 and the clock signals ICLKR, ICLKRa, and OCLKR input to and/or output from the first divide-by-2N frequency divider 1045 shown in FIG. 10.

The period of the high-frequency clock signals ICLKR input to the first divide-by-2N frequency divider 1045 may be twice the period of the high-frequency clock signal ICLKi input to the divide-by-N frequency-division and phase-alignment unit 1023. The period of the drowsy reference clock signal OCLKR may be twice the period of each of the drowsy clock signals OCLKi. When the period doubles, the frequency halves.

The clock signals clk0a and clk1a may be obtained by frequency dividing the first and second high-frequency clock signals clk0 and clk1 by 2. Accordingly, the period of each of the clock signals clk0a and clk1a may be twice the period of each of the first and second high-frequency clock signals clk0 and clk1. The clock signal clk1a may be obtained by delaying the phase of the clock signal clk0a by 180°. The phases of the clock signals clk0a and clk1a may be aligned so as to have a constant or substantially constant phase difference.

The first and second drowsy clock signals oclk0 and oclk1 may be obtained by frequency dividing the clock signals clk0a and clk1a by 2. Accordingly, the period of each of the first and second drowsy clock signals oclk0 and oclk1 may be twice the period of each of the clock signals clk0a and clk1a. The second drowsy clock signal oclk1 may be obtained by delaying the phase of the first drowsy clock signal oclk0 by 180°. The phases of the first and second drowsy clock signals oclk0 and oclk1 may be aligned so as to have a constant or substantially constant phase difference.

As described above, the electrical performance of the internal circuit 22 of the integrated circuit device 201 may be tested at a lower or relatively low speed by producing the drowsy clock signals MCLKi having lower or relatively low frequencies using the phase synchronizer 241 or 1011, e.g., a PLL or a DLL, included in the integrated circuit device 201. Hence, the integrated circuit device 201 may be tested using lower or relatively low speed test equipment without the need for special high-speed test equipment. This leads to a reduction of the testing costs for the integrated circuit device 201. In addition, because the drowsy clock signals MCLKi generated by the drowsy clock signal generation unit 231 are applied directly to the internal circuit 221, external noise may be suppressed and/or prevented from entering the internal circuit 221. Thus, the performance of the internal circuit 221 may be more accurately tested.

Furthermore, the integrated circuit device 201 may include either the frequency division and phase alignment unit 253 or the divide-by-N frequency division and phase alignment unit 1023 so as to align the drowsy clock signals oclk0 through oclk4 so that each consecutive drowsy clock signal has a constant or substantially constant phase difference compared to that of the preceding drowsy clock signal. Thus, the odd number of drowsy clock signals oclk0 through oclk4 may be generated more smoothly.

According to at least some example embodiments, N may be any suitable number, for example, a natural number such as 1, 2, 4, 8, etc.

Example embodiments may be applicable to both circuits that generate an even number of drowsy clock signals using a phase synchronizer and circuits that generate an odd number of drowsy clock signals using a phase synchronizer. An example embodiment in which two drowsy clock signals are generated and an example embodiment in which five drowsy clock signals are generated have been illustrated.

While the example embodiments have been particularly shown and described with reference to these example embodiments, it will be understood by those of ordinary skill in the art that various changes in form and details may be made therein without departing from the spirit and scope of the present invention as defined by the following claims.

What is claimed is:

1. An integrated circuit device comprising:
    a phase synchronizer configured to output a plurality of clock signals having different phases in response to an external clock signal;
    a drowsy clock signal output unit configured to divide frequencies of the plurality of clock signals by a first factor to generate a plurality of drowsy clock signals, align the plurality of drowsy clock signals to create a constant phase difference between each consecutive drowsy clock signal, and output the plurality of drowsy clock signals to an internal circuit for testing the performance of the internal circuit, the plurality of drowsy clock signals having lower frequencies and different phases than the plurality of clock signals; and
    a feedback unit configured to divide a frequency of one of the plurality of clock signals having a phase angle of 0 degrees by the first factor and output the frequency-divided clock signal having a phase angle of 0 degrees to an input port of the phase synchronizer.

2. The integrated circuit device of claim 1, wherein the phase synchronizer is one of a phase locked loop (PLL) and a delay locked loop (DLL).

3. The integrated circuit device of claim 1, wherein the external clock signal is a low frequency clock signal output by test equipment for testing the integrated circuit device at a low speed, and the external clock signal and the plurality of drowsy clock signals have the same frequency.

4. The integrated circuit device of claim 1, wherein the drowsy clock signal output unit includes,
    a frequency-division and phase-alignment unit configured to generate the drowsy clock signals and align the phases of the drowsy clock signals; and
    a first multiplexer configured to select one of the plurality of drowsy clock signals or the plurality of clock signals in response to a selection signal, and apply the selected plurality of signals to an internal circuit.

5. The integrated circuit device of claim 4, wherein when five drowsy clock signals are generated during half of a cycle and the first factor is at least two, the phase synchronizer outputs a first clock signal having a phase of 0 degrees and second through fifth clock signals sequentially delayed relative to the first clock signal by a first phase.

6. The integrated circuit device of claim 5, wherein the frequency division and phase alignment unit includes,
    a first frequency divider configured to frequency-divide the first through fifth clock signals to generate first through fifth frequency-divided clock signals and invert the fourth and fifth frequency-divided clock signals to generate the plurality of drowsy clock signals.

7. The integrated circuit device of claim 5, wherein when the first factor is four, the frequency division and phase alignment unit further includes,
    a first frequency divider configured to frequency-divide the first through fifth clock signals and invert the fourth and fifth frequency-divided clock signals to generate first through fifth frequency-divided clock signals, and
    a second frequency divider configured to frequency-divide the first through fifth frequency-divided clock signals to generate sixth through tenth frequency-divided clock signals and invert the ninth and tenth frequency-divided clock signals to generate the plurality of drowsy clock signals.

8. The integrated circuit device of claim 5, wherein when the first factor is a multiple of four, the frequency division and phase alignment unit further includes,
    a first frequency divider configured to frequency-divide the first through fifth clock signals and invert the fourth and fifth frequency-divided clock signals to generate first through fifth frequency-divided clock signals, and
    a second frequency divider configured to frequency-divide the first through fifth frequency-divided clock signals to generate sixth through tenth frequency-divided clock signals and invert the ninth and tenth frequency-divided clock signals, and
    a third frequency divider configured to frequency-divide the sixth through tenth frequency-divided clock signals to generate eleventh through fifteenth frequency-divided clock signals and invert the fourteenth and fifteenth frequency-divided clock signals to generate the plurality of drowsy clock signals.

9. The integrated circuit device of claim 4, wherein when two drowsy clock signals are generated during half of a cycle, and the first factor is at least two, the phase synchronizer outputs a first clock signal having a phase of 0 degrees and a second clock signal having a phase difference of 180 degrees relative to the first clock signal.

10. The integrated circuit device of claim 9, wherein the frequency division and phase alignment unit includes,
a first frequency-divider configured to frequency divide the first clock signal by two to generate a first drowsy clock signal, invert the second clock signal, and frequency divide the inverted second clock signal by two to generate a second drowsy clock signal having a phase difference of 180 degrees relative to the first drowsy clock signal.

11. The integrated circuit device of claim 9, wherein when the number of drowsy clock signals generated during half of a cycle is two, and the first factor is a multiple of two, the frequency division and phase alignment unit includes,
a first frequency-divider configured to frequency divide the first clock signal by two to generate a first drowsy clock signal, invert the second clock signal, and frequency divide the inverted second clock signal by two to generate a second drowsy clock signal having a phase difference of 180 degrees relative to the first drowsy clock signal, and
a second frequency-divider configured to frequency divide the first drowsy clock signal by two to generate a third drowsy clock signal, invert the second drowsy clock signal, and frequency divide the inverted second drowsy clock signal by two to generate a fourth drowsy clock signal having a phase difference of 180 degrees relative to the third drowsy clock signal, the third and fourth drowsy clock signals being output as the plurality of drowsy clock signals.

12. The integrated circuit device of claim 1, wherein the feedback unit includes,
a frequency divider configured to frequency-divide a clock signal having the 0 degree phase by the first factor, and
a multiplexer configured to select one of the clock signal having the 0 degree phase and a clock signal output by the frequency divider in response to a selection signal and apply the selected signal to the phase synchronizer.

13. The integrated circuit device of claim 1, wherein the first factor is N, and N is a natural number, and the integrated circuit device further includes,
a drowsy reference clock signal output unit configured to frequency-divide a clock signal having a phase of 0 degrees by 2N and output a drowsy reference clock signal.

14. The integrated circuit device of claim 13, wherein the phase synchronizer is one of a phase locked loop (PLL) and a delay locked loop (DLL).

15. The integrated circuit device of claim 13, wherein the external clock signal is a clock signal output by test equipment for testing the integrated circuit device at a low speed and the external clock signal and the drowsy clock signals have the same frequency.

16. The integrated circuit device of claim 13, wherein the drowsy reference clock signal output unit includes,
a first frequency divider configured to divide a clock signal having a phase angle of 0 degrees by two,
a second frequency divider configured to divide the clock signal having a phase angle of 0 degrees by 2N, and
a multiplexer configured to select one of a clock signal output by the first frequency divider or a clock signal output by the second frequency divider in response to a selection signal and apply the selected signal to an internal circuit.

17. The integrated circuit device of claim 13, wherein the feedback unit includes,
a first frequency divider configured to divide a clock signal having a phase angle of 0 degrees by two,
a second frequency divider configured to divide the clock signal having a phase angle of 0 degrees by 2N, and
a multiplexer configured to select one of a clock signal output by the first frequency divider and a clock signal output by the second frequency divider in response to a selection signal and apply the selected signal to the phase synchronizer.

18. The integrated circuit device of claim 13, wherein the drowsy clock signal output unit includes,
a frequency-division and phase-alignment unit configured to frequency-divide the plurality of clock signals by N to generate the plurality of drowsy clock signals and align the phases of the plurality of drowsy clock signals, and
a first multiplexer configured to select one of the plurality of drowsy clock signals or the plurality of clock signals in response to a selection signal, and apply the selected plurality of signals to an internal circuit.

19. The integrated circuit device of claim 18, wherein when five drowsy clock signals are generated during half of a cycle and N is at least two, the phase synchronizer outputs a first clock signal having a phase of 0 degrees and second through fifth clock signals sequentially delayed relative to the first clock signal by a first phase.

20. The integrated circuit of claim 19, wherein the frequency division and phase alignment unit includes,
a first frequency divider configured to frequency-divide the first through fifth clock signals to generate first through fifth frequency-divided clock signals and invert the fourth and fifth frequency-divided clock signals to generate the plurality of drowsy clock signals.

21. The integrated circuit device of claim 20, wherein when N is equal to four, the frequency division and phase alignment unit further includes a set including,
a first frequency divider configured to frequency-divide the first through fifth clock signals and invert the fourth and fifth frequency-divided clock signals to generate first through fifth frequency-divided clock signals, and
a second frequency divider configured to frequency-divide the first through fifth frequency-divided clock signals to generate sixth through tenth frequency-divided clock signals and invert the ninth and tenth frequency-divided clock signals to generate the plurality of drowsy clock signals.

22. The integrated circuit device of claim 21, wherein when N is equal to a multiple of four, the frequency division and phase alignment unit further includes,
a first frequency divider configured to frequency-divide the first through fifth clock signals and invert the fourth and fifth frequency-divided clock signals to generate first through fifth frequency-divided clock signals, and
a second frequency divider configured to frequency-divide the first through fifth frequency-divided clock signals to generate sixth through tenth frequency-divided clock signals and invert the ninth and tenth frequency-divided clock signals, and
a third frequency divider configured to frequency-divide the sixth through tenth frequency-divided clock signals to generate eleventh through fifteenth frequency-divided clock signals and invert the fourteenth and fifteenth frequency-divided clock signals to generate the plurality of drowsy clock signals.

23. The integrated circuit device of claim 18, wherein when two drowsy clock signals are generated during half of a cycle and N is at least two, the phase synchronizer outputs a first clock signal having a phase of 0 degrees and a second clock signal having a phase difference of 180 degrees with respect to the first clock signal.

24. The integrated circuit of claim 23, wherein the frequency division and phase alignment unit includes a set including,
   a first frequency-divider configured to frequency divide the first clock signal by two to generate a first drowsy clock signal, invert the second clock signal, and frequency divide the inverted second clock signal by two to generate a second drowsy clock signal having a phase difference of 180 degrees relative to the first drowsy clock signal.

25. The integrated circuit device of claim 22, wherein when the number of drowsy clock signals generated during half of a cycle is two and N is a multiple of two, the frequency division and phase alignment unit further includes,
   a first frequency-divider configured to frequency divide the first clock signal by two to generate a first drowsy clock signal, invert the second clock signal, and frequency divide the inverted second clock signal by two to generate a second drowsy clock signal having a phase difference of 180 degrees relative to the first drowsy clock signal, and
   a second frequency-divider configured to frequency divide the first drowsy clock signal by two to generate a third drowsy clock signal, invert the second drowsy clock signal, and frequency divide the inverted second drowsy clock signal by two to generate a fourth drowsy clock signal having a phase difference of 180 degrees relative to the third drowsy clock signal, the third and fourth drowsy clock signals being output as the plurality of drowsy clock signals.

* * * * *